United States Patent
Kuo et al.

(10) Patent No.: US 11,749,625 B2
(45) Date of Patent: Sep. 5, 2023

(54) SEMICONDUCTOR STRUCTURE INCLUDING ONE OR MORE ANTENNA STRUCTURES

(71) Applicant: TAIWAN SEMICONDUCTOR MANUFACTURING COMPANY, LTD., Hsinchu (TW)

(72) Inventors: Feng-Wei Kuo, Hsinchu (TW); Wen-Shiang Liao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/118,017

(22) Filed: Dec. 10, 2020

(65) Prior Publication Data

US 2021/0327833 A1 Oct. 21, 2021

Related U.S. Application Data

(60) Provisional application No. 63/011,441, filed on Apr. 17, 2020.

(51) Int. Cl.
*H01L 23/66* (2006.01)
*H01L 23/538* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC ............. H01L 21/4853; H01L 21/4857; H01L 21/565; H01L 21/568; H01L 21/6835;
(Continued)

(56) References Cited

U.S. PATENT DOCUMENTS 9,431,369 B2 * 8/2016 Chih ...................... H01L 23/66
10,468,763 B2 11/2019 Yokoyama et al.
(Continued)

FOREIGN PATENT DOCUMENTS

| CN | 107078406 A | 8/2017 |
| JP | 2007180704 A | 7/2007 |
| TW | I512907 B | 12/2015 |

OTHER PUBLICATIONS

"Characteristics" Insulating Film "Ajinomoto Build-up Film" (ABF), Ajinomoto Fine-Techno Co., Inc., Oct. 30, 2015, < https://www.aft-website.com/en/electron/abf>. Mar. 12, 2022. (Year: 2015).*

(Continued)

*Primary Examiner* — Kyoung Lee
*Assistant Examiner* — Christina A Sylvia
(74) *Attorney, Agent, or Firm* — Hauptman Ham, LLP

(57) ABSTRACT

A semiconductor structure includes a first redistribution structure, wherein the first redistribution structure includes first conductive pattern. The semiconductor structure further includes a die over the first redistribution structure. The semiconductor structure further includes a molding over the first redistribution structure, wherein the molding surrounds the die, and the molding has a first dielectric constant. The semiconductor structure further includes a dielectric member extending through the molding, wherein the dielectric member has a second dielectric constant different from the first dielectric constant. The semiconductor structure further includes a second redistribution structure over the die, the dielectric member and the molding, wherein the second redistribution layer includes an antenna over the dielectric member, and the antenna is electrically connected to the die.

20 Claims, 28 Drawing Sheets

(51) Int. Cl.
  *H01L 23/00* (2006.01)
  *H01L 21/48* (2006.01)
  *H01L 21/56* (2006.01)
  *H01L 21/683* (2006.01)
  *H01Q 9/04* (2006.01)
  *H01Q 1/52* (2006.01)
  *H01L 23/31* (2006.01)

(52) U.S. Cl.
  CPC ......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 1/52* (2013.01); *H01Q 9/0407* (2013.01); *H01L 2221/68372* (2013.01); *H01L 2223/6677* (2013.01); *H01L 2224/214* (2013.01)

(58) Field of Classification Search
  CPC ............ H01L 23/3128; H01L 23/5383; H01L 23/5386; H01L 23/5389; H01L 23/49816; H01L 23/66; H01L 24/19; H01L 24/20; H01L 2221/68372; H01L 2221/68345; H01L 2221/6835; H01L 2223/6677; H01L 2224/214; H01Q 1/52; H01Q 1/2283; H01Q 9/0407
  See application file for complete search history.

(56) References Cited

U.S. PATENT DOCUMENTS

| | | | |
|---|---|---|---|
| 2013/0292808 A1* | 11/2013 | Yen | H01L 21/561 257/E23.114 |
| 2016/0218072 A1* | 7/2016 | Liao | H01L 23/66 |
| 2017/0033062 A1* | 2/2017 | Liu | H01L 23/528 |
| 2017/0271264 A1* | 9/2017 | Lee | H01L 24/75 |
| 2018/0061698 A1* | 3/2018 | Tsai | H01L 29/0649 |
| 2018/0166396 A1* | 6/2018 | Lee | H01L 23/5386 |
| 2018/0337136 A1* | 11/2018 | Han | H01L 23/5389 |
| 2020/0295453 A1* | 9/2020 | Kuo | H01L 23/3128 |
| 2021/0098860 A1* | 4/2021 | Kuo | H01L 23/5384 |

OTHER PUBLICATIONS

Notice of Allowance dated Aug. 20, 2021 for corresponding application No. TW 11020811860. (pp. 1-3).

Search Report dated Aug. 19, 2021 for corresponding application No. JP 110108168. (p. 1).

\* cited by examiner

SEMICONDUCTOR STRUCTURE INCLUDING ONE OR MORE ANTENNA STRUCTURES

CROSS-REFERENCE TO RELATED APPLICATIONS

This application claims priority of U.S. provisional application Ser. No. 63/011,441 filed on Apr. 17, 2020, which is incorporated by reference in its entirety.

BACKGROUND

Semiconductor devices are becoming steadily smaller while having more functionality and greater amounts of integrated circuitry. To accommodate the miniaturized scale of the semiconductor device, integrated circuits have emerged as an effective alternative to further reduce the physical size of a semiconductor device. A wafer-level packaging (WLP) process is widely used due to its low cost and relatively simple manufacturing operations.

Various technologies and applications have been developed for the wafer-level packaging, involving greater numbers of different components with different materials. For example, millimeter (mm)-wave antennas with RF integrated circuits (ICs) are used in high-frequency applications.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
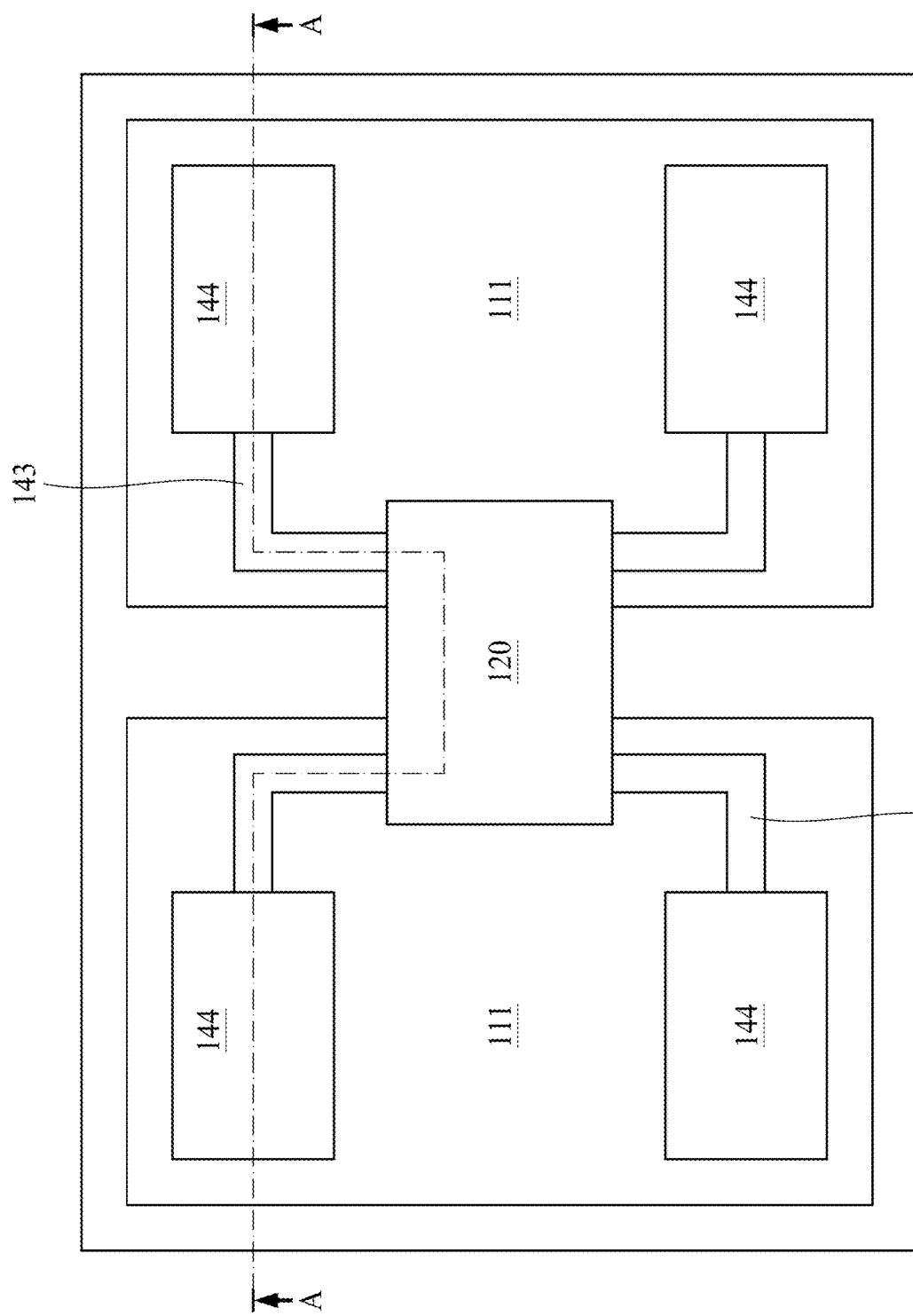
FIG. 1 is a schematic top view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, semiconductor structures and methods of manufacturing the same are provided. In particular, a semiconductor structure with one or more antenna structures is described below. In addition, methods of forming the semiconductor structure including one or more antenna structures are also provided below. Other features and processes may also be included. The semiconductor structure includes a dielectric member configured to resonate with the antenna structure. The dielectric member provided according to some embodiments of the present disclosure may improve the reflection coefficient of the antenna structure in the semiconductor structure, especially in high-frequency applications that employ antenna efficiency at frequencies of 5.8 GHz and higher. The dielectric member also helps reduce the undesirable coupling of the antenna structure to nearby circuits, and prevent unwanted noise from the circuits from reaching the antenna structure. Further, a resonant frequency of the antenna structure can be tuned as desired by adjusting a size of the dielectric member or a material used to form the dielectric member.

Figure 2:
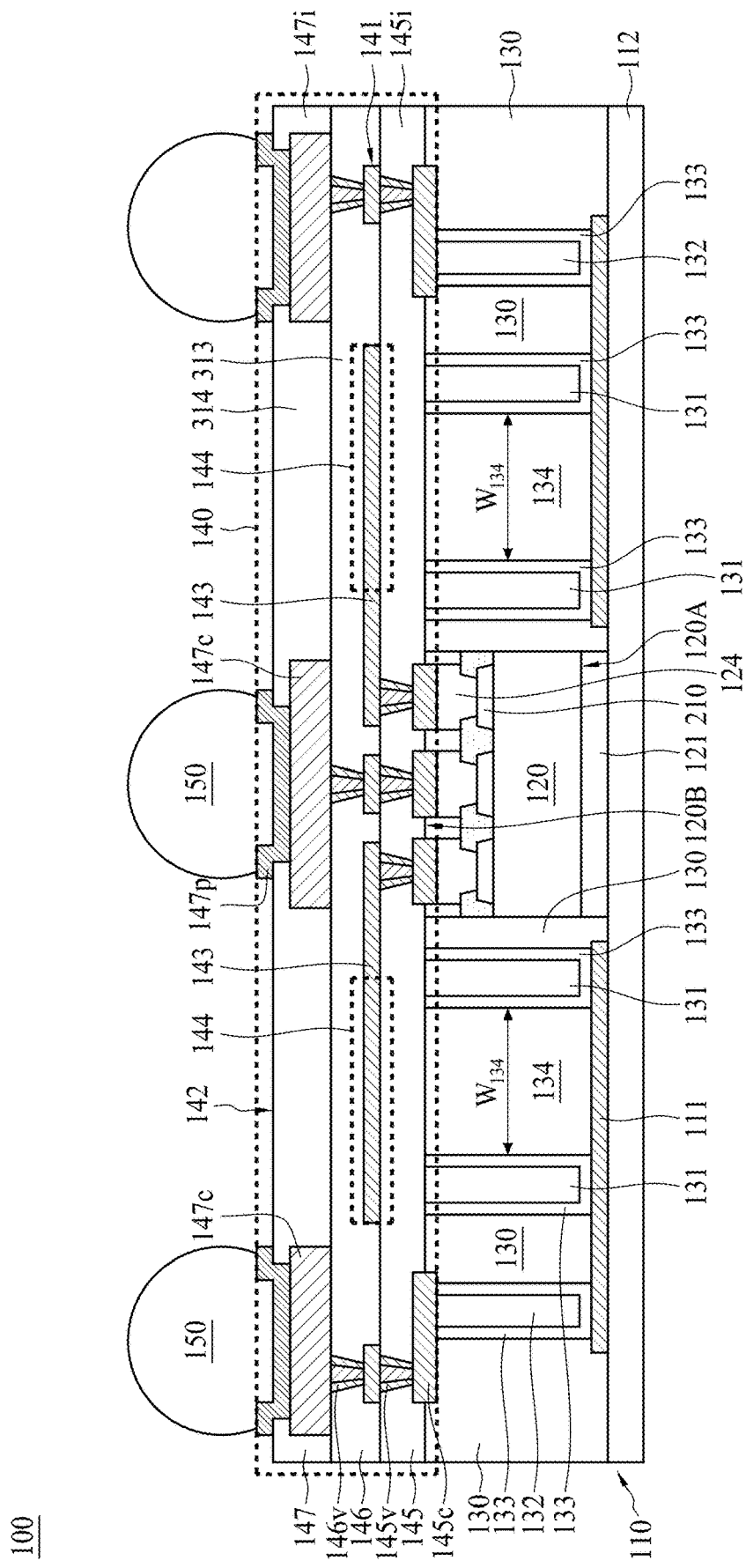
FIG. 2 is a schematic cross-sectional view taken along line A-A in FIG. 1.

FIG. 1 is a schematic top view of a semiconductor structure 100 according to aspects of the present disclosure in some embodiments. FIG. 2 is a schematic cross-sectional view taken along line A-A of FIG. 1 of the semiconductor structure 100 according to aspects of the present disclosure.

In some embodiments, referring to FIGS. 1 and 2, the semiconductor structure 100 includes a first redistribution structure 110 including a first conductive pattern 111, a die 120 disposed over the first redistribution structure 110, and a molding 130 disposed over the first redistribution structure 110 and surrounding the die 120. In some embodiments, the semiconductor structure 100 further includes a dielectric member 134 extending through the molding 130, a first conductive via 131 extending through the molding 130 and disposed adjacent to the dielectric member 134, and a second redistribution structure 140 including a second conductive pattern 141 disposed over the die 120, the dielectric member 134 and the molding 130. The second conductive pattern 141 includes an antenna structure 144 disposed over the dielectric member 134 and electrically connected to the die 120. In some embodiments, a dielectric constant (k) of the dielectric member 134 is substantially different from a dielectric constant of the molding 130. The semiconductor structure 100 is suitable for meeting the specifications of future $4^{th}$ generation (5.8 GHz) and $5^{th}$ generation (including 12 GHz or 38 GHz) high-frequency RF transceivers in mobile communication applications.

In some embodiments, the first redistribution structure 110 comprises any number of dielectric layers, metallization patterns, and vias. In some embodiments, the first redistribution structure 110 is a backside redistribution line (RDL). In some embodiments, the first redistribution structure 110 includes a first dielectric layer 112. In some embodiments, the first dielectric layer 112 includes a polymer, such as, for example, polyimide, polyBenzOxazole (PBO), benzocyclobutene (BCB), ajinomoto buildup film (ABF), solder resist film (SR), or the like. In some embodiments, the first dielectric layer 112 is a planar layer having a uniform thickness, wherein the thickness is between about 2 microns (μm) and about 40 μm. In some embodiments, the thickness is between about 5 μm and about 40 μm. The top and bottom surfaces of the first dielectric layer 112 are also planar. In some embodiments, the first dielectric layer 112 acts as the protective insulator for the semiconductor structure 100. In some embodiments, first dielectric layer 112 includes a plurality of sub-dielectric layers. In some embodiments, the materials included in the sub-dielectric layers are the same material or different materials.

In some embodiments, the first conductive pattern 111 of the first redistribution structure 110 is formed on the first dielectric layer 112. In some embodiments, the first conductive pattern 111 includes aluminum, titanium, copper, nickel, tungsten, and/or alloys thereof. In some embodiments, the first conductive pattern 111 is a wiring pattern. In some embodiments, the first conductive pattern 111 includes a grounded metal pattern. In some embodiments, the thickness of the first conductive pattern 111 is between about 1 μm and about 40 μm. As a thickness of the first conductive pattern 111 increases, the cost is too high in some embodiments. As a thickness of the first conductive pattern 111 decreases, the resistance of the first conductive pattern 111 is too high in some embodiments. In some embodiments, the thickness of the first conductive pattern 111 is between about 1 μm and about 20 μm. In some embodiments, the thickness of the first conductive pattern 111 is between about 2 μm and about 8 μm. In some embodiments, the thickness of the first conductive pattern 111 is about 7 μm to minimize a resistance of the first conductive pattern 111. In some embodiments, a seed layer (not shown) is disposed between the first dielectric layer 112 and the first conductive pattern 111. In some embodiments, the seed layer is blanketed over and conformal to the first conductive pattern 111. In some embodiments, the seed layer includes a titanium/copper composite layer.

In some embodiments, a plurality of first conductive patterns 111 are disposed on the first dielectric layer 112. FIGS. 1 and 2 include only two first conductive patterns 111 for clarity and simplicity, but such example is intended to be illustrative only, and is not intended to be limiting to the embodiments. A person ordinarily skilled in the art would readily understand that any suitable number of the first conductive patterns 111 may alternatively be utilized, and all such combinations are fully intended to be included within the scope of the embodiments. Additionally, the first conductive patterns 111 have similar features; this is intended to be illustrative and is not intended to limit the embodiments, as the first conductive patterns 111 have similar structures or different structures, in some embodiments, in order to meet the desired functional capabilities.

One or more dies 120 are attached to the first redistribution structure 110. For simplicity and purpose of illustration, only one die 120 is shown in FIGS. 1 and 2; however, the die 120 in the figures represents one or more dies 120, in some embodiments. In some embodiments, the die 120 is disposed on the first dielectric layer 112. In some embodiments, the die 120 is adjacent to the first conductive patterns 111. In some embodiments, the die 120 is a radio frequency (RF) integrated circuit (IC) die. The die 120 has a rear surface 120a and a front surface 120b opposite to the rear surface 120a. In some embodiments, the rear surface 120a of the die 120 is attached (or adhered) to the first redistribution structure 110 through an adhesive layer 121. In some embodiments, the adhesive layer 121 includes a die attach film (DAF) or another material having adhesive properties. The front surface 120b of the die 120 faces the second redistribution structure 140.

In some embodiments, the die 120 includes a semiconductor substrate 122 whose back surface is the rear surface 120a of the die 120 and is in contact with the adhesive layer 121. In some embodiments, the die 120 includes a plurality of conductive pads 123 disposed over the semiconductor substrate 122, a plurality of conductive pillars 124 exposed from the front surface 120b of the die 120 and configured to electrically connect the die 120 to other conductive devices and/or interconnect structures in the semiconductor structure 100.

In some embodiments, the semiconductor substrate 122 is a silicon substrate including active components (e.g., transistors or the like) and passive components (e.g., resistors, capacitors, inductors, or the like) formed therein. In some embodiments, the conductive pads 123 are aluminum pads, copper pads, or other suitable metal pads. In some embodiments, the conductive pillar 124 is made of conductive materials and is placed on the conductive pads 123. For example, in some embodiments, a material of the conductive pillar 124 includes copper, copper alloys, or the like. A die dielectric layer 125 is disposed between the conductive pillars 124 and exposed from the front surface 120b of the die 120. In some embodiments, the top surface of the die dielectric layer 125 and the top surfaces of the conductive pillars 124 are at the same level. In some embodiments, the top surface of the die dielectric layer 125 is located at a level higher than top surfaces of the conductive pillars 124. However, the disclosure is not limited thereto.

The molding 130 is disposed over the first redistribution structure 110. In some embodiments, the molding 130 surrounds or encapsulates the first conductive vias 131 and the die 120. The molding 130 fills the gaps between the die 120 and the first conductive vias 131, and is in contact with portions of the first conductive pattern 111 and the first dielectric layer 112, in some embodiments. In some embodiments, the top surface of the molding 130 is substantially at a same level as the top surfaces of the conductive pillars 124 of the die 120. In some embodiments, the molding 130 includes a molding compound, a polymer compound, an underfill material, a resin, an epoxy, or the like. In some embodiments, the molding 130 includes fillers. In some embodiments, the molding 130 has a dielectric constant (k) less than or equal to 3.0, preferably between 2.8 and 3.0. In some embodiments, the molding 130 includes high-k or low-k dielectric materials.

In some embodiments, the first conductive vias 131 is disposed on the first redistribution structure 110 and adjacent to the die 120. In some embodiments, the first conductive vias 131 extends substantially perpendicular to the first conductive pattern 111. In some embodiments, the first conductive via 131 is a through insulating via (TIV) extending through the molding 130. In some embodiments, the height of the first conductive via 131 is between about 100 μm and about 500 μm. As a height of the first conductive via 131 increases, the process parameters of the current manufacturing process are not applicable in some embodiments. As a height of the first conductive via 131 decreases, the resistance of the first conductive via 131 is too high in some embodiments. In some embodiments, the height of the first conductive via 131 is between about 120 μm and about 250 μm. As a width of the first conductive via 131 increases, the process parameters of the current manufacturing process are not applicable in some embodiments. As a width of the first conductive via 131 decreases, the resistance of the first conductive via 131 is too high in some embodiments. In some embodiments, the width (or diameter) of the first conductive via 131 is about 100 um to about 200 um. In some embodiments, a width of the first conductive via 131 is about 150 um.

In some embodiments, the semiconductor structure 100 includes a plurality of the first conductive vias 131. In some embodiments, the first conductive vias 131 are disposed at one or more sides of the die 120. In some embodiments, the die 120 is disposed between the first conductive vias 131 in a cross-sectional view as shown in FIG. 2, such that the first conductive vias 131 are disposed on two opposite sides of the die 120. In some embodiments, the front surface 120b of the die 120 is substantially coplanar with the top surfaces 131t of the first conductive vias 131 or is at a level lower or higher than the top surfaces 131t of the first conductive vias 131. In some embodiments, the first conductive vias 131 surround the die 120. At least one of the first conductive via 131 is disposed along a side of the die 120. One of ordinary skill in the art would understand that the number of the first conductive vias 131 in FIG. 2 merely serves as an exemplary illustration, and the number of the first conductive vias 131 is capable of variation based on a design of the semiconductor device 100.

In some embodiments, the semiconductor structure 100 further includes a second conductive via 132. In some embodiments, the second conductive via 132 is disposed on the first redistribution structure 110 and adjacent to the first conductive vias 131 die 120. In some embodiments, the second conductive via 132 extends substantially perpendicular to the first conductive pattern 111. In some embodiments, a plurality of second conductive vias 132 are disposed at one or more sides of the die 120. In some embodiments, the second conductive via 132 is also known as a TIV extending through the molding 130. In some embodiments, the height of the second conductive vias 132 is between about 100 μm and about 500 μm. As a height of the second conductive vias 132 increases, the process parameters of the current manufacturing process are not applicable in some embodiments. As a height of the second conductive vias 132 decreases, the resistance of the second conductive vias 132 is too high in some embodiments. In some embodiments, the height of the second conductive vias 132 is between about 120 μm and about 250 μm. As a width of the second conductive vias 132 increases, the process parameters of the current manufacturing process are not applicable in some embodiments. As a width of the second conductive vias 132 decreases, the resistance of the second conductive vias 132 is too high in some embodiments. In some embodiments, the width (or diameter) of the second conductive via 132 is about 100 um to about 200 um. In some embodiments, a width of the second conductive via 132 is about 150 um. In some embodiments, the first conductive via 131 and the second conductive via 132 have similar structural configurations.

In some embodiments, the first conductive via 131 is electrically connected to the first conductive pattern 111 of the first redistribution structure 110. In some embodiments, the first conductive via 131 is isolated from the second conductive pattern 141 of the second redistribution structure 140. In some embodiments, the second conductive via 132 is electrically connected to the first conductive pattern 111 of the first redistribution structure 110 and the second conductive pattern 141 of the second redistribution structure 140. In some embodiments, the second conductive via 132 is connected between the first conductive pattern 111 and the second conductive pattern 141, and further electrically connected to the interconnection structures such as the conductive bump 150.

In some embodiments, a seed layer 133 is disposed between the first conductive via 131 and the molding 130, and/or the second conductive via 132 and the molding 130. In some embodiments, the seed layer 133 is disposed between the first conductive via 131 and the first conductive pattern 111. In some embodiments, the seed layer 133 is disposed between the second conductive via 132 and the first conductive pattern 111. In some embodiments, the seed layer 133 is blanketed over and conformal to the corresponding first conductive via 131. In some embodiments, the seed layer 133 is blanketed over and conformal to the corresponding second conductive via 132. In some embodiments, the seed layer 133 includes a titanium/copper composite layer.

In some embodiments, the dielectric member 134 extending through the molding 130 is disposed over the first conductive pattern 111. In some embodiments, the dielectric member 134 is disposed over or on the molding 130. In some embodiments, the dielectric member 134 is in contact with the first conductive pattern 111. In some embodiments, the dielectric member 134 is adjacent to the first conductive via 131. In some embodiments, the dielectric member 134 is disposed between the first conductive vias 131. One of ordinary skill in the art would understand that the number of the dielectric members 134 shown in FIG. 1 merely serves as an exemplary illustration, and the number of the first conductive vias 131 is capable of variation based on a design of the semiconductor device 100. A person ordinarily skilled in the art would readily understand that any suitable number of the dielectric members 134 is alternatively able to be utilized, and all such combinations are fully intended to be included within the scope of the embodiments. Additionally, the dielectric members 134 have similar features; this is intended to be illustrative and is not intended to limit the embodiments, as the dielectric members 134 have similar structures or different structures in order to meet the desired functional capabilities, in some embodiments. In some embodiments, the dielectric member 134 and the first conductive via 131 are both surrounded by the molding 130.

In some embodiments, the configuration and size of the dielectric member 134 depends on the material of the dielectric member 134, the material of the molding 130, and the configuration and size of the antenna structure 144. In some embodiments, the dielectric member 134 has a dielectric constant different from a dielectric constant of the molding 130. In some embodiments, the dielectric constant of the dielectric member 134 is substantially greater than the dielectric constant of the molding 130. In some embodiments, the dielectric constant of the dielectric member 134 is substantially equal to or greater than 3. In some embodiments, the dielectric constant of the dielectric member 134 is equal to or greater than 4. In some embodiments, the dielectric constant of the dielectric member 134 is equal to or greater than 7. In some embodiments, the dielectric constant of the dielectric member 134 is equal to or greater than 10. In some embodiments, the dielectric constant of the dielectric member 134 is equal to or greater than 80. In some embodiments, the dielectric constant of the dielectric member 134 is equal to or greater than 100. In some embodiments, the dielectric constant of the dielectric member 134 is equal to or greater than 200, to help to optimize a dimension reduction of the dielectric member 134. The greater the dielectric constant of the dielectric member 134, the smaller the size of the dielectric member 134 can be. In some embodiments, the dielectric member 134 includes $SiO_2$, $SiN_x$, $SiO_xN_y$, $ZrO_2$, $Al_2O_3$, $HfO_x$, $HfSiO_x$, $ZrTiO_x$, $TiO_2$, $TaO_x$, $SrTiO_3$, $BaTiO_3$, $BaSrTiO_3$, $PbZrTiO_3$, a high-k polymer, or a combination thereof.

Figure 3:
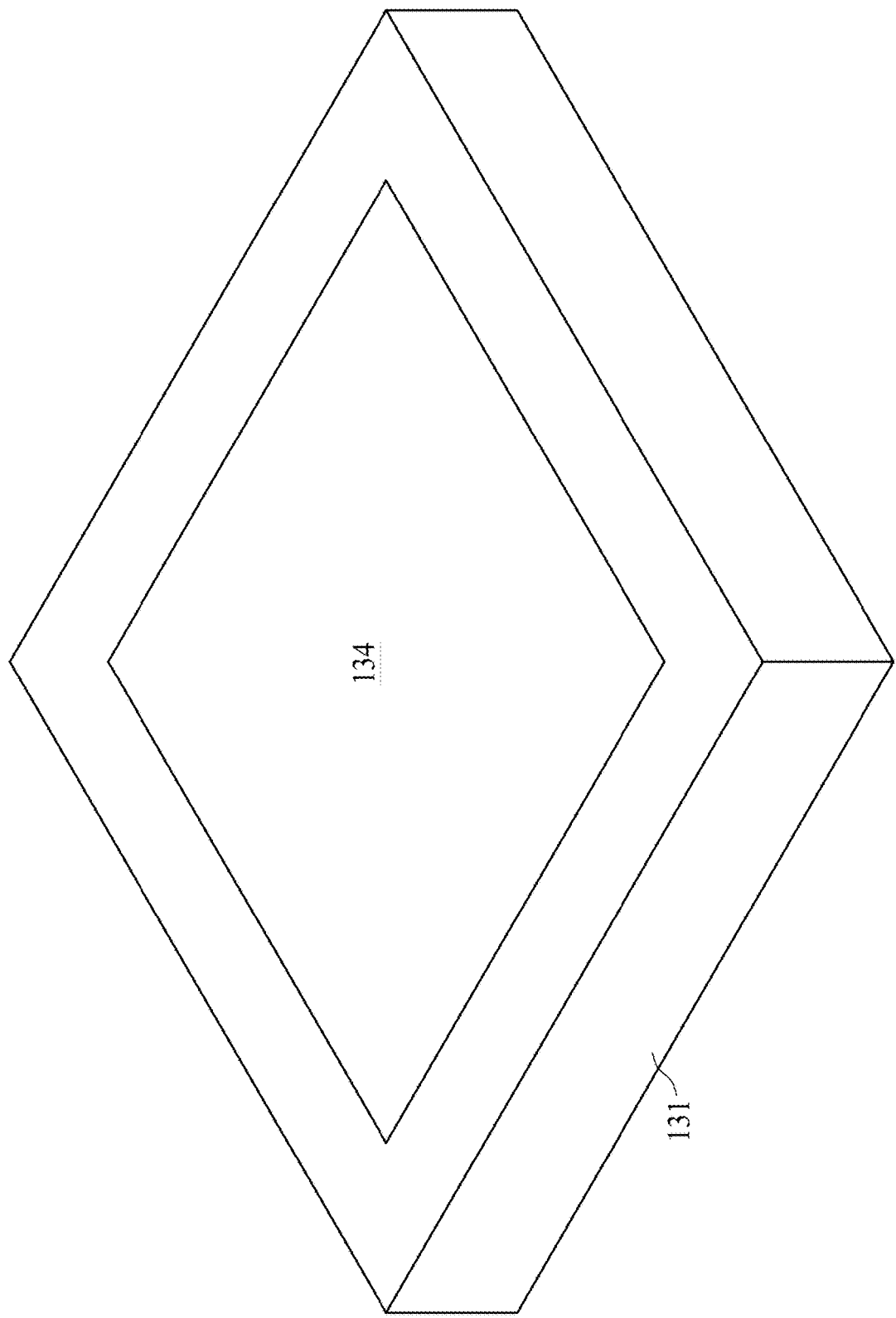
FIGS. 3 and 4 are schematic perspective views of an antenna structure of a semiconductor structure in accordance with some embodiments of the present disclosure.
Figure 4:
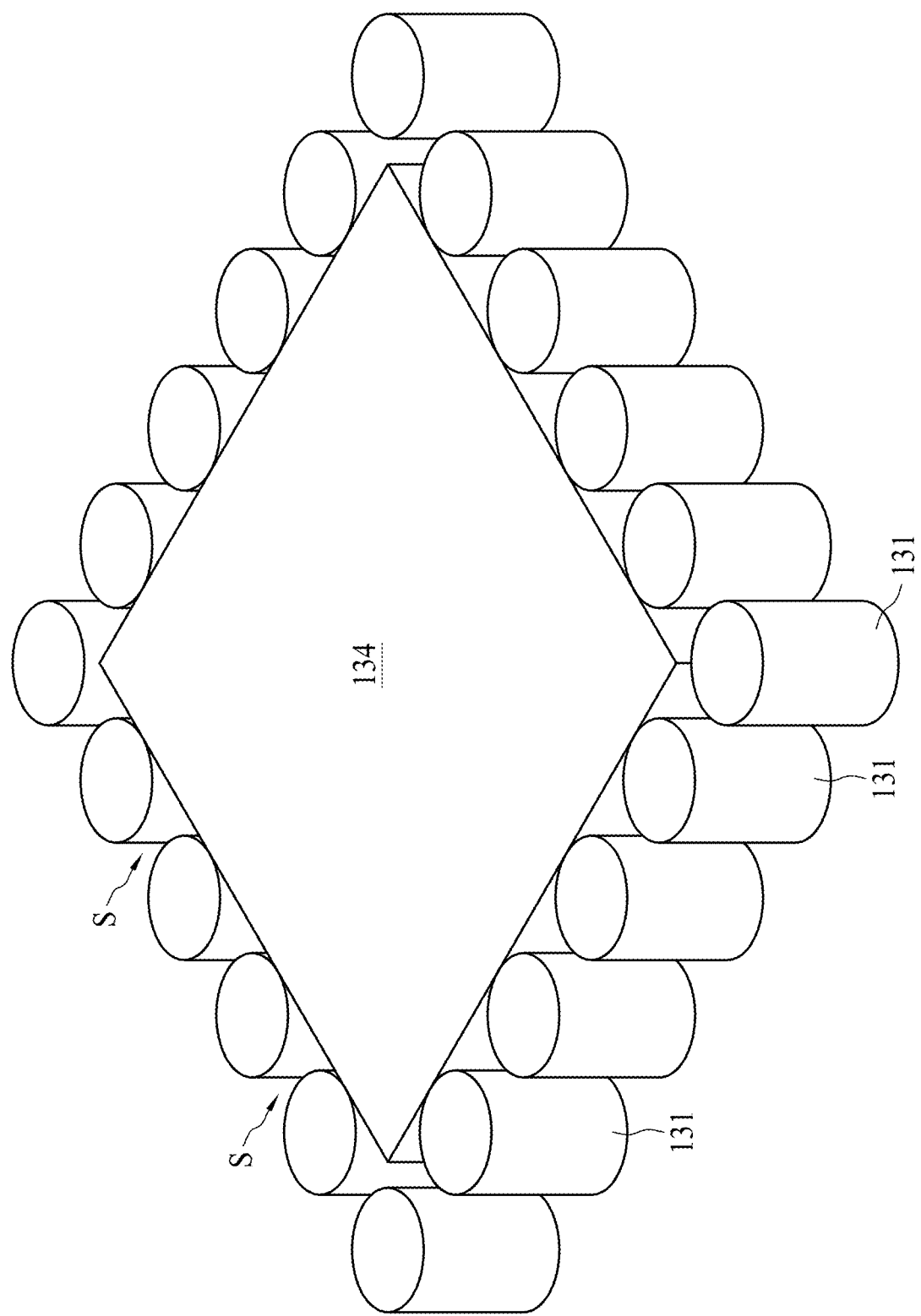

In some embodiments, the plurality of first conductive vias 131 are disposed along a periphery of the dielectric member 134. FIGS. 3 and 4 are perspective views of portions of the semiconductor structure 100. Referring to FIG. 3, in some embodiments, each of the first conductive vias 131 is formed as a single continuous wall structure electrically connected to the first conductive pattern 111 enclosing the dielectric member 134 underneath the antenna structure 144. In some embodiments, the dielectric member 134 has a square shape in a top view. In some embodiments, the dielectric member 134 is, but is not limited to, round, oval, rectangular, square or another shape in a top view.

In some embodiments, referring to FIG. 4, the dielectric member 134 is surrounded by the plurality of first conductive vias 131 that together define the perimeter of the dielectric member 134. The spacing S between the adjacent first conductive vias 131 is adjustable according to the wavelengths of the signals the antenna structure 144 is intended to transmit or receive during operation. In some embodiments, the spacing S is about 10 μm. In some embodiments, the spacing S between one pair of adjacent first conductive vias 131 is different from the spacing S between a different pair of adjacent first conductive vias 131. The space between the first conductive vias 131 is filled with the molding 130. In some embodiments, two or more first conductive vias 131 are continuous segments that together enclose the dielectric member 134.

Referring back to FIGS. 1 and 2, the second redistribution structure 140 including the second conductive pattern 141 is disposed over the die 120, the dielectric member 134, the molding 130 and the first and second conductive vias 131, 132. In some embodiments, the second conductive pattern 141 includes wiring patterns at least partially over the die 120 and/or wiring patterns at least partially over the molding 130. The second redistribution structure 140 provides electrical connection between the die 120 and the interconnection structures such as a conductive bump 150 disposed on the second redistribution structure 140. The conductive bump 150 may provide electrical connection to the next level packaging such as, for example, a printed circuit board (PCB) or an interposer. In some embodiments, the first conductive pattern 111 of the first redistribution structure 110 is electrically connected to the conductive bump 150 through the second conductive pattern 141 of the second redistribution structure 140. In some embodiments, the conductive bump 150 includes solder.

In some embodiments, the second redistribution structure 140 comprises any number of dielectric layers, metallization patterns, and vias. In some embodiments, the second redistribution structure 140 includes a second dielectric layer 142. In some embodiments, the second dielectric layer 142 includes a polymer, which may be, for example, polyimide, polyBenzOxazole (PBO), benzocyclobutene (BCB), ajinomoto buildup film (ABF), solder resist film (SR), or the like.

In some embodiments, the second conductive pattern 141 of the second redistribution structure 140 is disposed in the second dielectric layer 142. In some embodiments, the second conductive pattern 141 includes aluminum, titanium, copper, nickel, tungsten, and/or alloys thereof. In some embodiments, the second conductive pattern 141 is a wiring pattern.

In some embodiments, the second redistribution structure 140 includes first, second and third redistribution layers 145, 146, 147 each including a plurality of conductive patterns. One of ordinary skill in the art would understand that the number of the redistribution layers shown in FIG. 2 merely serves as an exemplary illustration, and different numbers of redistribution layers can be included. Each of the first, second and third redistribution layers 145, 146, 147 comprises redistribution lines (RDLs) and vias, wherein the RDLs and vias are metal patterns that provide electrical interconnections through and within the second redistribution structure 140. In some embodiments, the RDLs and vias comprise copper. In the first redistribution layer 145, first-level conductors 145c and first-level vias 145v provide the interconnections. In the first redistribution layer 145, a first insulating layer 145i is disposed over the first-level conductors 145c, the die 120, the dielectric member 134, the molding 130, the first conductive vias 131, and the TIVs 132. In the second redistribution layer 146, second-level conductors 146c and second-level vias 146v provide the interconnections. In the second redistribution layer 146, a second insulating layer 146i is disposed over the second-level conductors 146c. In the third redistribution layer 147, which is the last redistribution layer, third-level conductors 147c and under ball metal (UBM) pads 147p provide the interconnections. The conductive bumps 150 are formed on the UBM pads 147p. In the third redistribution layer 147, a third insulating layer 146i is provided over the second insulating layer 147c.

The second conductive pattern 141 includes one or more antenna structures 144 disposed over the dielectric member 134 and electrically connected to the die 120. In some embodiments, the antenna structures 144 are disposed over the plurality of dielectric members 134 correspondingly and electrically connected to the die 120. In some embodiments, two antenna structures 144 are disposed opposite to each other, and the die 120 is disposed between two antenna structures 144 in a top view of FIG. 1. In some embodiments, the antenna structures 144 surround the die 120 in a top view as in FIG. 1. A person ordinarily skilled in the art would readily understand that any suitable number of the antenna structures 144 are alternatively utilized, in some embodiments, and all such combinations are fully intended to be included within the scope of the embodiments. Additionally, the antenna structures 144 have similar features; this is intended to be illustrative and is not intended to limit the embodiments, as the antenna structures 144 have similar structures or different structures in order to meet the desired functional capabilities, in some embodiments.

In some embodiments, the antenna structure 144 is configured to radiate electromagnetic radiation for wireless transmission or to receive electromagnetic radiation for wireless reception, and the dielectric member 134 is configured to improve antenna performance and efficiency in high-frequency applications. In some embodiments, the antenna structure 144 is a patch antenna. In some embodiments, the patch antenna is a micro-strip antenna comprising a flat rectangular sheet or "patch" of metal, mounted over a larger sheet of metal called a ground plane, such as the first conductive pattern 111. In some embodiments, the antenna structure 144 is a transceiver.

Each antenna structure 144 corresponds to one dielectric member 134 underneath the corresponding antenna structure 144. In some embodiments, the second conductive pattern 141 includes a conductive line 143 electrically coupling the antenna structure 144 to the die 120. In some embodiments, the conductive line 143 extends from each antenna structure 144 to the die 120.

In some embodiments, the antenna structure 144 is disposed in one of the first, second and third redistribution layers 145, 146, 147. In some embodiments, the antenna structure 144 is disposed in the second redistribution layer 146. The antenna structure 144 is isolated from the dielectric member 134. In some embodiments, the first insulating layer 145i is disposed between the dielectric member 134 and the antenna structure 144 and configured to isolate the antenna structure 144 from the dielectric member 134. The dielectric member 134 is sandwiched between the antenna structure 144 and the first conductive pattern 111.

Figure 5:
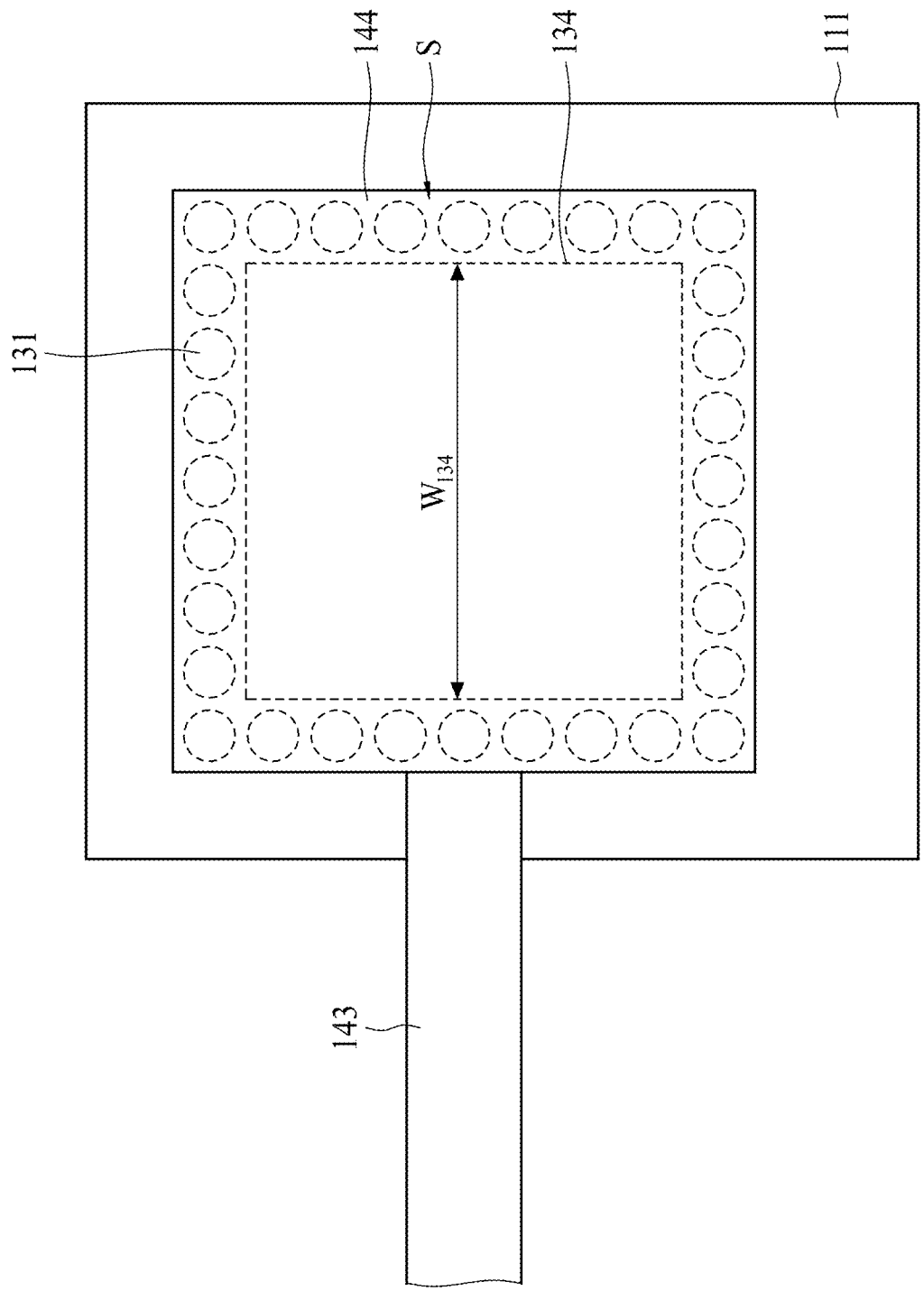
FIGS. 5 to 7 are schematic top views of a portion of a semiconductor structure in accordance with some embodiments of the present disclosure.
Figure 6:
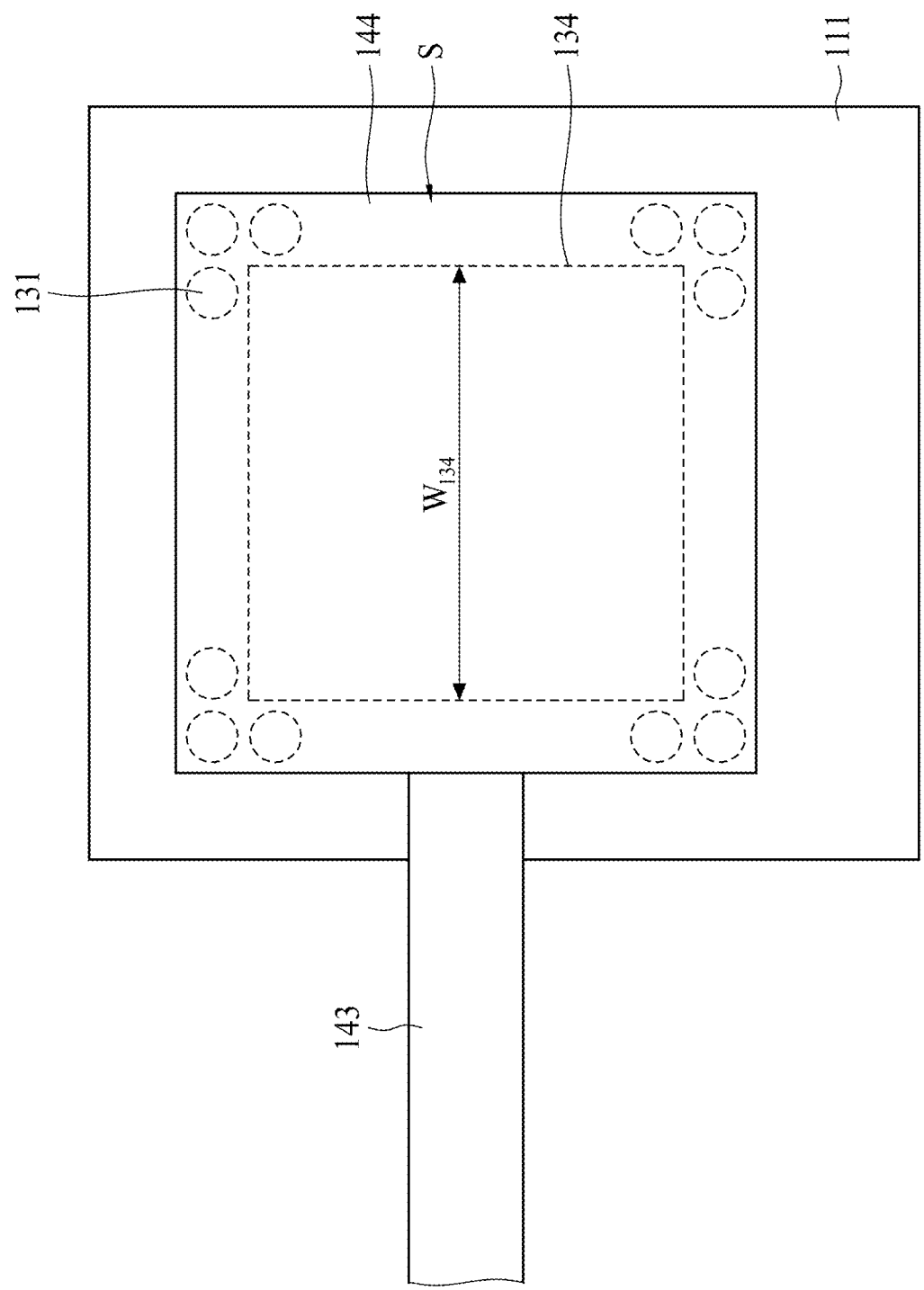
Figure 7:
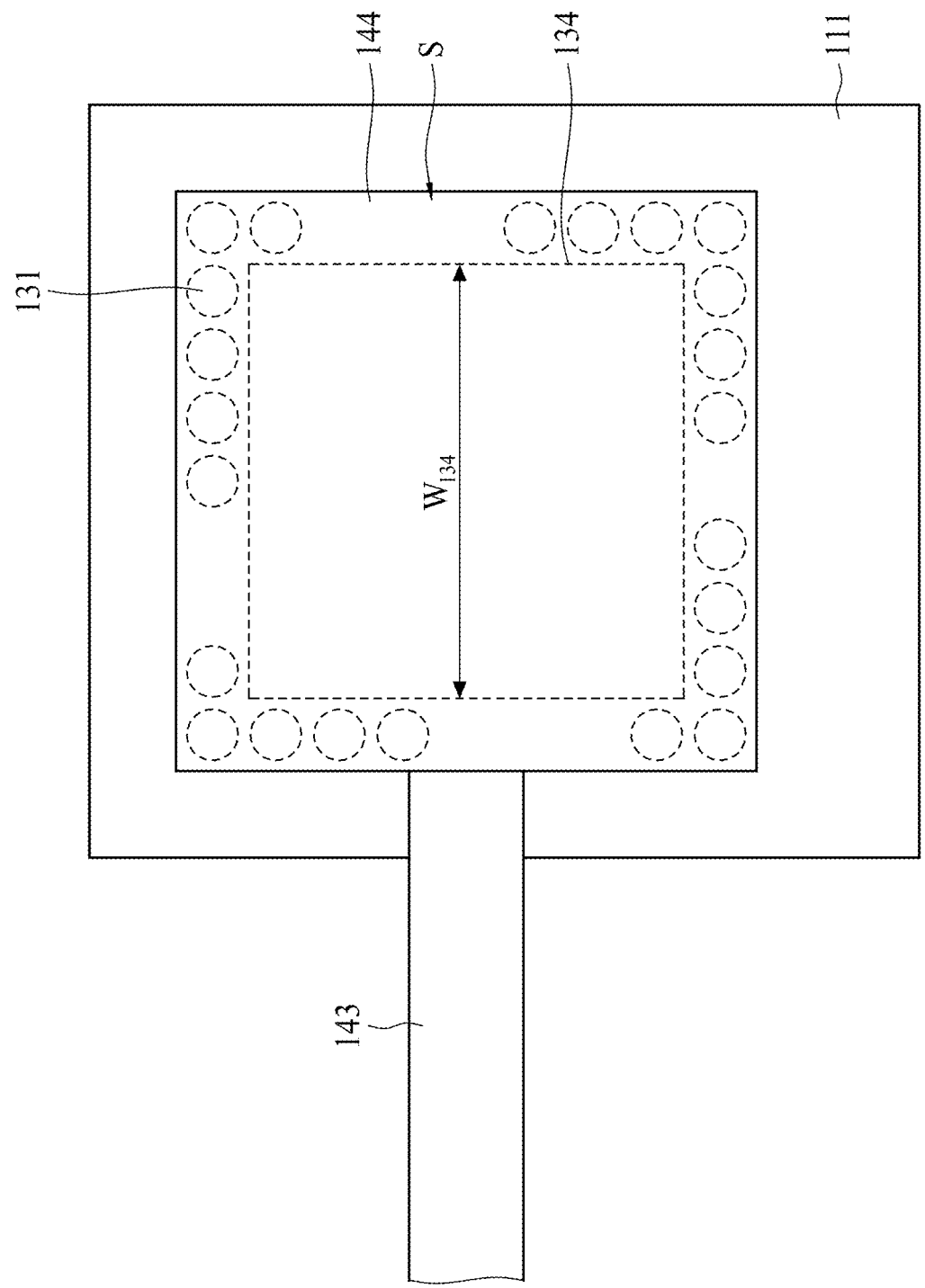

FIGS. 5 to 7 are schematic views of a portion of the semiconductor structure 100. Referring to FIGS. 1, 2, 5 to 7, the dielectric member 134 and the antenna structure 144 are overlapped from a top view perspective. In some embodiments, the antenna structure 144 covers the dielectric member 134 in a top view. In some embodiments, a width $W_{134}$ of the dielectric member 134 is substantially less than or equal to a width of the antenna structure 144. In some embodiments, the higher the dielectric constant of the dielectric member 134, the smaller the width $W_{134}$ of the dielectric member 134 can be. In some embodiments, a surface area of the dielectric member 134 is substantially less than or equal to a surface area of the antenna structure 144. In some embodiments, when the difference between the dielectric constants k of the dielectric member 134 and the antenna structure 144 is greater, the difference between the surface areas of dielectric member 134 and the antenna structure 144 is also be greater. In some embodiments, as the dielectric constant k of the dielectric member 134 increases, the surface area of the dielectric member 134 decreases. In some embodiments, the first conductive vias 131 disposed along the periphery of the dielectric member 134 and the antenna structure 144 overlap each other in a top view as in FIGS. 5 to 7.

In some embodiments, the first conductive vias 131 are continuous segments that together enclose the dielectric member 134 underneath the antenna structure 144 as in FIG. 5. The spacing S between one pair of adjacent first conductive vias 131 is substantially equal to the spacing S between other pairs of adjacent first conductive vias 131. In some embodiments, referring to FIG. 6, the first conductive vias 131 are discontinuous segments and disposed adjacent to the corners of the dielectric member 134. In some embodiments, the first conductive vias 131 are discontinuous segments that together enclose the dielectric member 134 underneath the antenna structure 144 as in FIG. 7. In some embodiments, the spacing S between one pair of adjacent first conductive vias 131 is different from the spacing S between other pairs of adjacent first conductive vias 131.

Figure 8:
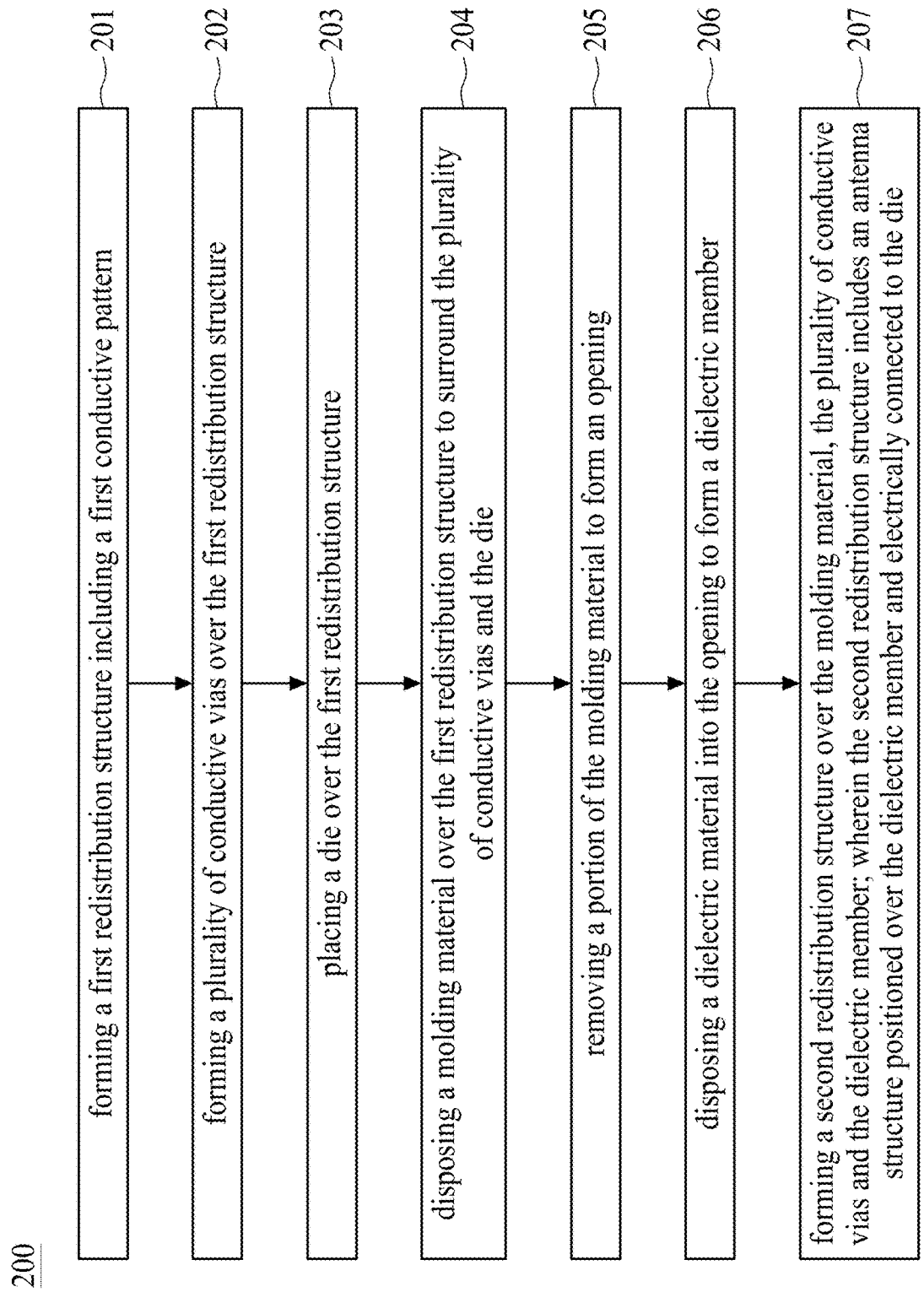
FIG. 8 is a flowchart of a method for forming a semiconductor structure in accordance with some embodiments of the present disclosure.

FIG. 8 is a flowchart of a method 200 for forming a semiconductor structure in accordance with some embodiments of the present disclosure. The method 200 includes several operations: (201) forming a first redistribution structure including a first conductive pattern; (202) forming a plurality of conductive vias over the first redistribution structure; (203) placing a die over the first redistribution structure; and (204) disposing a molding material over the first redistribution structure to surround the plurality of conductive vias and the die. The method 200 further includes (205) removing a portion of the molding material to form an opening; (206) disposing a dielectric material into the opening to form a dielectric member; and (207) forming a second redistribution structure over the molding material and the plurality of conductive vias and the dielectric member. The second redistribution structure includes an antenna structure positioned over the dielectric member and electrically connected to the die.

Figure 9:
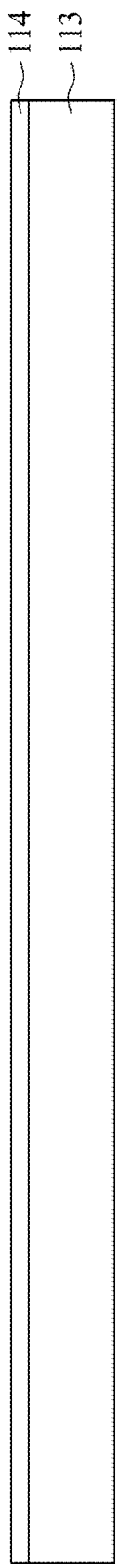
FIGS. 9 to 28 are schematic cross-sectional views of one or more stages of the method in accordance with some embodiments of the present disclosure.

FIGS. 9 to 28 are schematic cross-sectional views of a semiconductor device formed using the method 200 in accordance with some embodiments of the present disclosure. In some embodiments, the method 200 is configured to form the semiconductor structure 100 as in FIGS. 1 and 2. Referring to FIG. 9, a supporting substrate 113 having an adhesive layer 114 disposed thereon is provided. In some embodiments, the adhesive layer 114 is formed on a top surface of the supporting substrate 113. In some embodiments, the supporting substrate 113 is a glass substrate and the adhesive layer 114 is a light-to-heat conversion (LTHC) release layer applied on the supporting substrate 113. However, the disclosure is not limited thereto. In some alternative embodiments, other suitable materials is adapted for the supporting substrate 113 and the adhesive layer 114.

Figure 10:
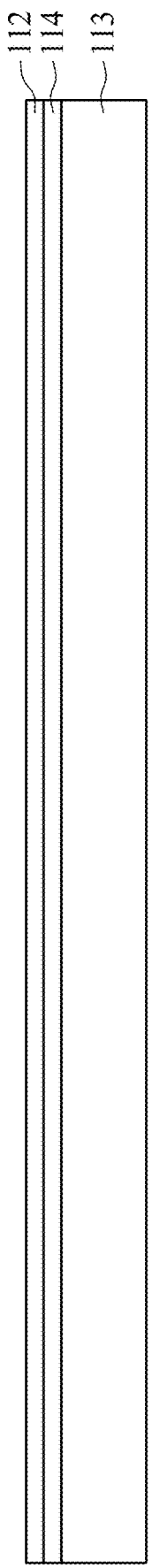

As in FIG. 10, a first dielectric layer 112 is formed on the adhesive layer 114. In some embodiments, the first dielectric layer 112 is formed by suitable fabrication techniques such as spin coating, chemical vapor deposition (CVD), plasma-enhanced chemical vapor deposition (PECVD), or the like. In some embodiments, the first dielectric layer 112 is a single layer or multiple layers stacked over each other. In some embodiments, the first dielectric layer 112 includes polymeric material. In some embodiments, the polymeric material includes low-temperature polyimide (LTPI), epoxy resin, acrylic resin, phenol resin, benzocyclobutene (BCB), polybenzooxazole (PBO), or any other suitable polymer-based dielectric material. In some embodiments, the polymeric material is dissolved in a solvent to enhance the coating fluidity. In some embodiments, after the polymeric material is uniformly coated on the adhesive layer 114, a curing process is performed to evaporate the solvent. For example, in some embodiments, the first dielectric layer 112 is cured through a soft-baking process.

Figure 11:
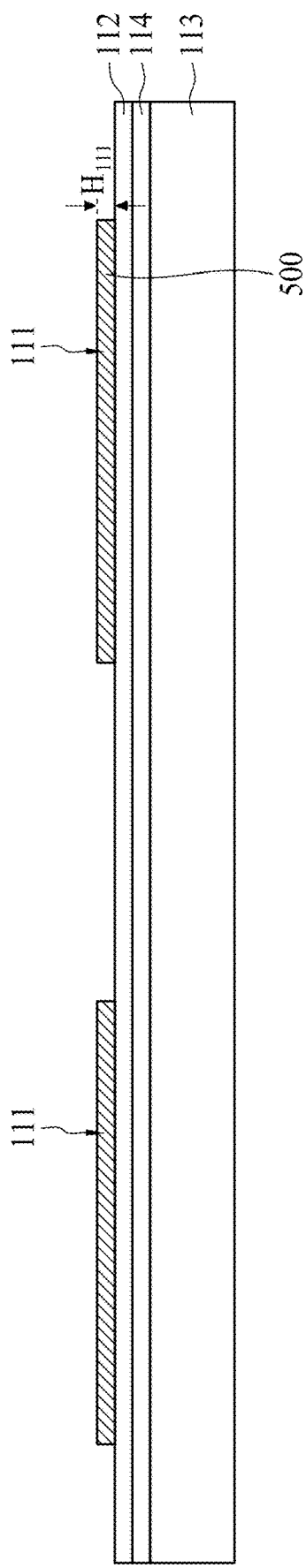

As in FIG. 11, a plurality of first conductive patterns 111 are formed on the first dielectric layer 112. The first conductive patterns 111 is formed by, for example, electroplating, deposition, and/or photolithography and etching. In some embodiments, the first conductive patterns 111 are formed by the following process. First, a seed layer (not shown) is blanketly formed over the first dielectric layer 112. In some embodiments, the seed layer includes a titanium/copper composite layer and is formed by a sputtering process. Next, a first mask pattern (not shown) having openings is formed on the seed layer. The openings of the first mask pattern expose the intended locations for the subsequently-formed first conductive patterns 111. Next, a plating process is performed to form a conductive material layer on portions of the seed layer exposed by the openings of the first mask pattern. In some embodiments, the conductive material layer includes aluminum, titanium, copper, nickel, tungsten, and/or alloys thereof. The first mask pattern and the seed layer are then removed by a stripping process and/or an etching process. The remaining seed layer and the remaining conductive material layer then constitute the first conductive patterns 111. In some embodiments, the first conductive pattern 111 is formed to have a height $H_{111}$ between about 1 μm and about 40 μm. As a height $H_{111}$ of the first conductive pattern 111 increases, the cost is too high in some embodiments. As a height $H_{111}$ of the first conductive pattern 111 decreases, then the resistance of the first conductive pattern 111 is too high in some embodiments.

Figure 12:
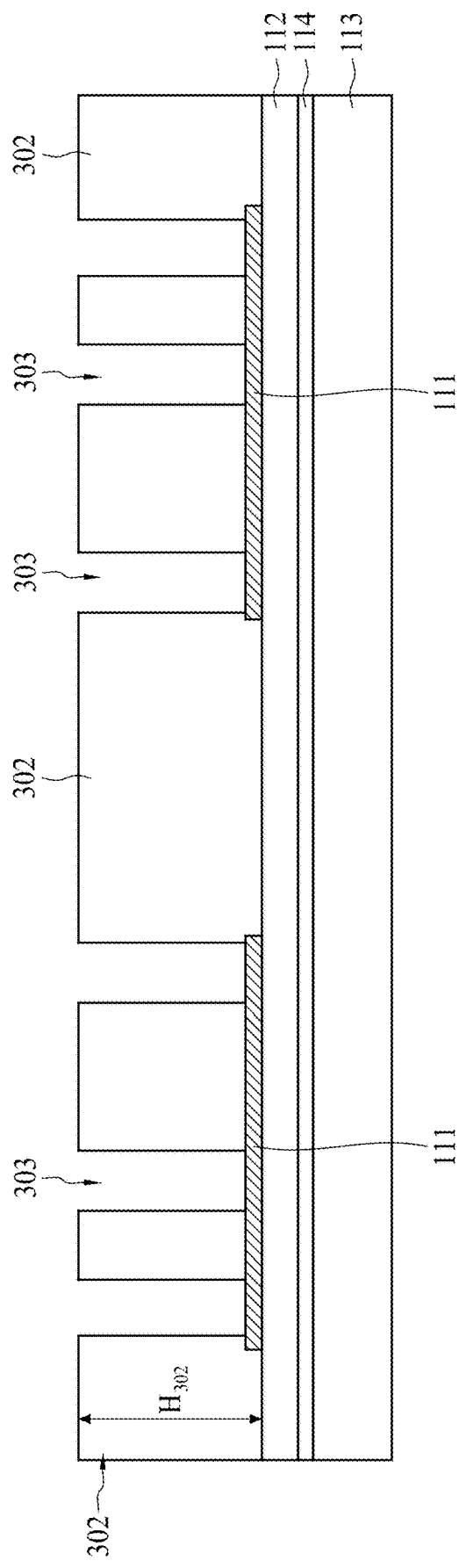

Referring to FIG. 12, a first patterned photoresist 302 is applied over the first conductive patterns 111 and the exposed portions of the first dielectric layer 112. In some embodiments, the first patterned photoresist 302 includes first recesses 303. The first recesses 303 expose some portions of the first conductive patterns 111. In some embodiments, the first patterned photoresist 302 is formed to have a height $H_{302}$ between about 100 μm and about 500 μm. As a height $H_{302}$ of the first patterned photoresist 302 increases, the cost of the first patterned photoresist 302 is too high in some embodiments. As a height $H_{302}$ of the first patterned photoresist 302 decreases, the process parameters of the current manufacturing process are not applicable in some embodiments. In some embodiments, the first and second conductive vias 131, 132 are formed within the first recesses 303. In some embodiments, the first recess 303 has a depth of about 50 μm to about 500 μm. A depth of the first recess 303 varies with the height $H_{302}$ of the first patterned photoresist 302 in some embodiments. As a depth of the first recess 303 increases, the cost of the first patterned photoresist 302 is too high in some embodiments. As a depth of the first recess 303 decreases, the process parameters of the current manufacturing process are not applicable in some embodiments. In some embodiments, the depth of the first recess 303 is from about 120 μm to about 250 μm. In some embodiments, the depth of the first recess 303 is 180 μm. The depth of the first recess 303 is determined based on the thickness of the first patterned photoresist 302.

In some embodiments, a seed layer (not shown) having a thickness between 1000 and 5000 Angstroms (Å) is formed on the structure of FIG. 12 in preparation for electroplating deposition of the first and second conductive vias 131, 132. As a thickness of the seed layer increases, the cost of the seed layer is too high in some embodiments. As a thickness of the seed layer decreases, the process parameters of the current manufacturing process are not applicable in some embodiments. In some embodiments, the seed layer covers the surfaces of the first patterned photoresist 302 and the exposed portion of the first redistribution structure 110, such as the first conductive pattern 111 at the bottom of the first recesses 303.

Figure 13:
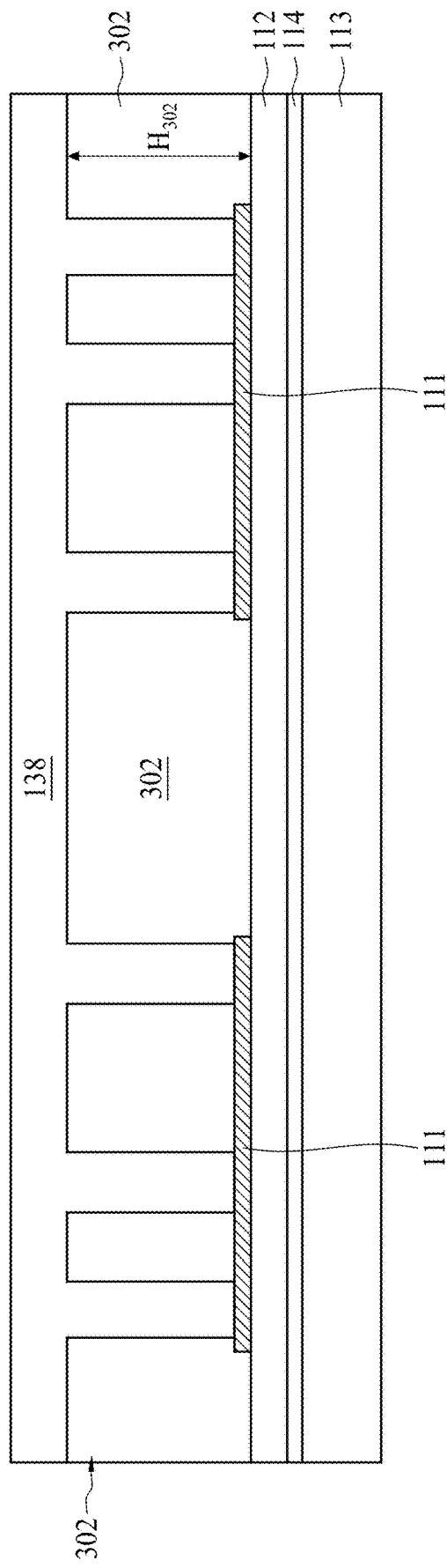

Referring to FIG. 13, in some embodiments, a conductive material 138 is deposited into the first recesses 303 by a plating process. The first recesses 303 are filled with conductive material 138 in order to form the first and second conductive vias 131, 132. In some embodiments, the plating process includes, for example, electroplating, electroless plating, immersion plating, or the like. However, the disclosure is not limited thereto. In some embodiments, the conductive material 138 includes, for example, copper, copper alloys, or the like. In some embodiments, the first and second conductive vias 131, 132 are formed by filling the first recesses 303 in the first photoresist 302 with conductive material 138 by plating, which is electroplating or electroless plating, on the seed layer.

Figure 14:
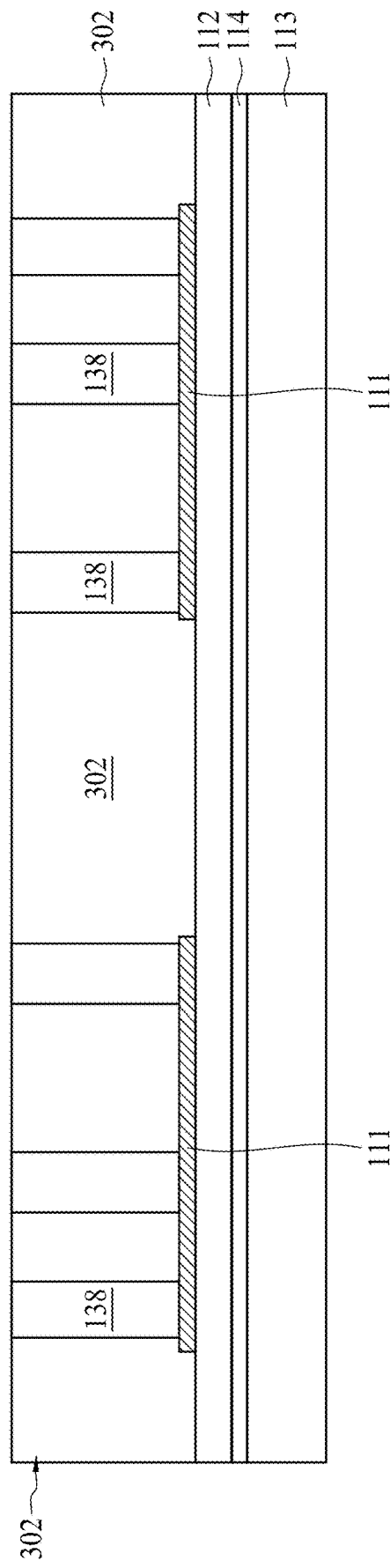

Next, referring to FIG. 14, in some embodiments, an excess portion of the conductive material 138 is removed by a grinding process to expose the top surface of the first patterned photoresist 302. The grinding process includes, for example, a mechanical grinding process, a chemical mechanical polishing (CMP) process, or the like. However, the disclosure is not limited thereto. In some alternative embodiments, the grinding process is omitted in some embodiments.

Figure 15:
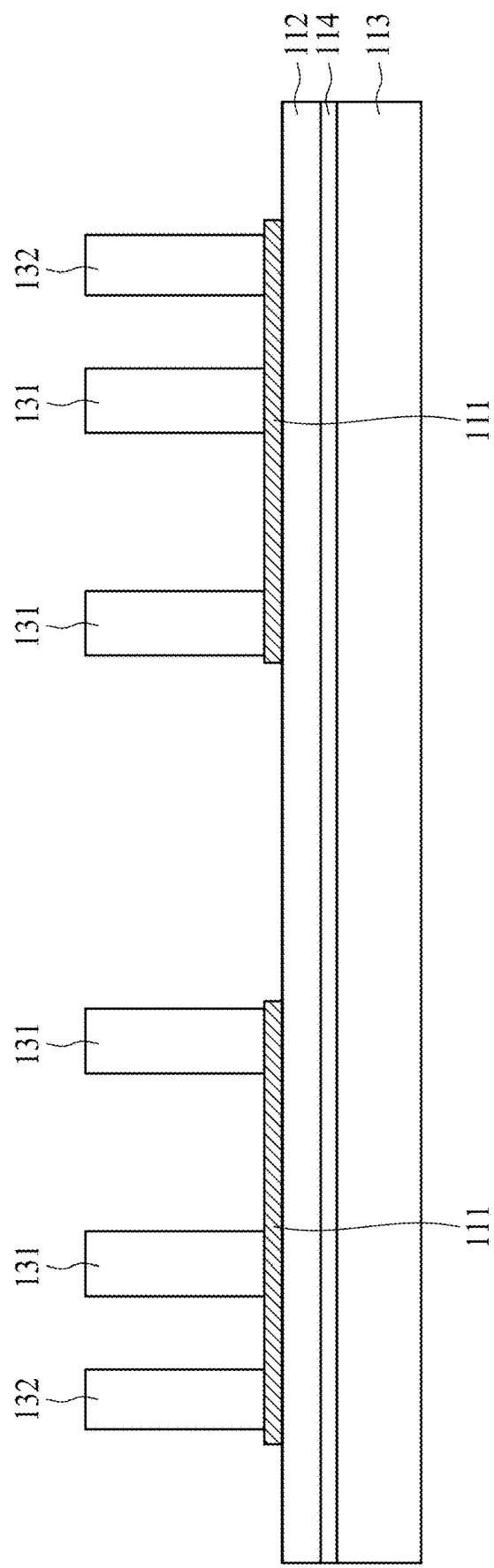

In some embodiments, as in FIG. 15, the first patterned photoresist 302 is removed and the first and second conductive vias 131, 132 are thus formed. In some embodiments, the first patterned photoresist 302 is removed through a stripping process, an etching process, and/or a cleaning process. For example, the first patterned photoresist 302 is removed by applying chemicals such as dimethyl sulfoxide (DMSO), water ($H_2O$), and tetramethyl ammonium hydroxide (TMAH). In some embodiments, upon removal of the first patterned photoresist 302, a portion of the seed layer (not shown) is exposed from the first and second conductive vias 131, 132. Subsequently, the exposed portion of the seed layer is removed through an etching process. In some embodiments, the etching process includes an anisotropic etching process such as a dry etch or an isotropic etching process such as a wet etch. In some embodiments, an etchant for the wet etch includes a combination of hydrogen fluoride (HF), copper (Cu), and ammonia ($NH_3$), a combination of HF and TMAH, or the like. In some embodiments, the conductive material and the remaining seed layer are collectively referred to as the first and second conductive vias 131, 132.

Figure 16:
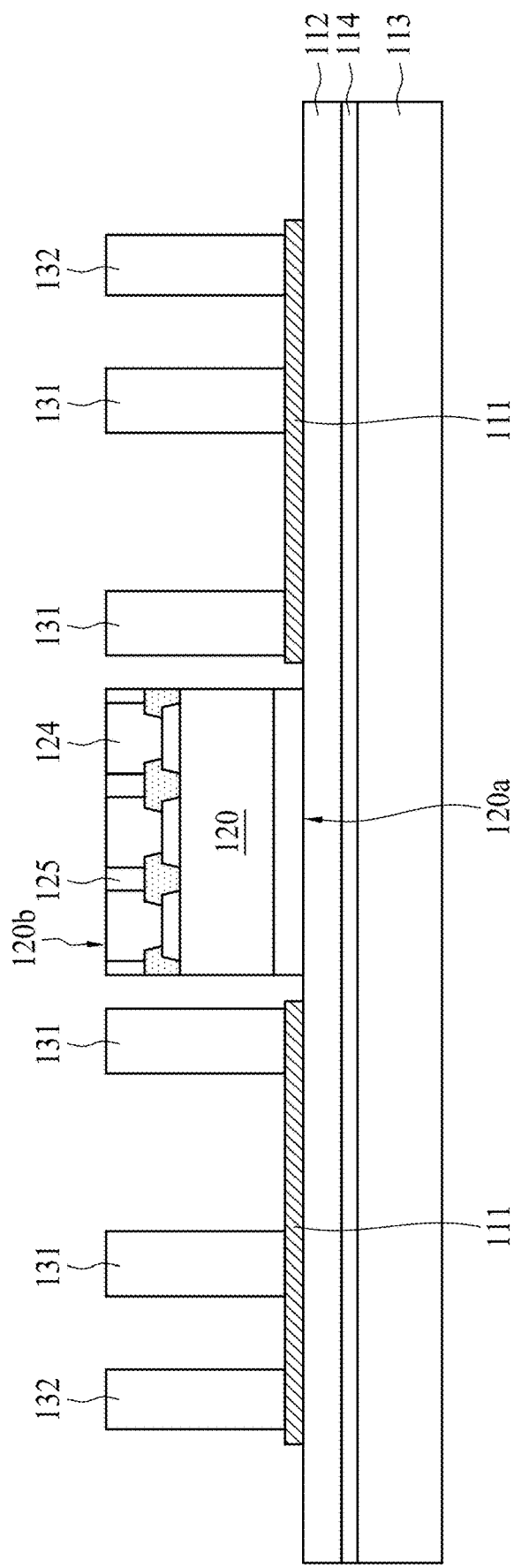

In some embodiments, as in FIG. 16, the die 120 is disposed on the first dielectric layer 112. In some embodiments, the die 120 is attached to the first dielectric layer 112 by a pick-and-place method. For example, the die 120 is attached to a blank wafer (not shown). The blank wafer is then flipped over to attach the die 120 to the first dielectric layer 112. The blank wafer is then detached from the die 120, for instance, by mechanical peeling. An annealing is optionally performed after placing the die 120 on the first dielectric layer 112. In some embodiments, the die 120 can be adhered to the first dielectric layer 112 using an adhesive layer 121. The die 120 may include a semiconductor substrate 122 in contact with the adhesive layer 121. In some embodiments, the conductive pillars 124 of the die 120 are formed as a portion of the front surface 120b of the die 120. A die dielectric layer 125 is formed at the front surface 120b of the die 120 and fills the spaces between the conductive pillars 124, with the conductive pillars 124 having at least their lower portions in the die dielectric layer 125.

Figure 17:
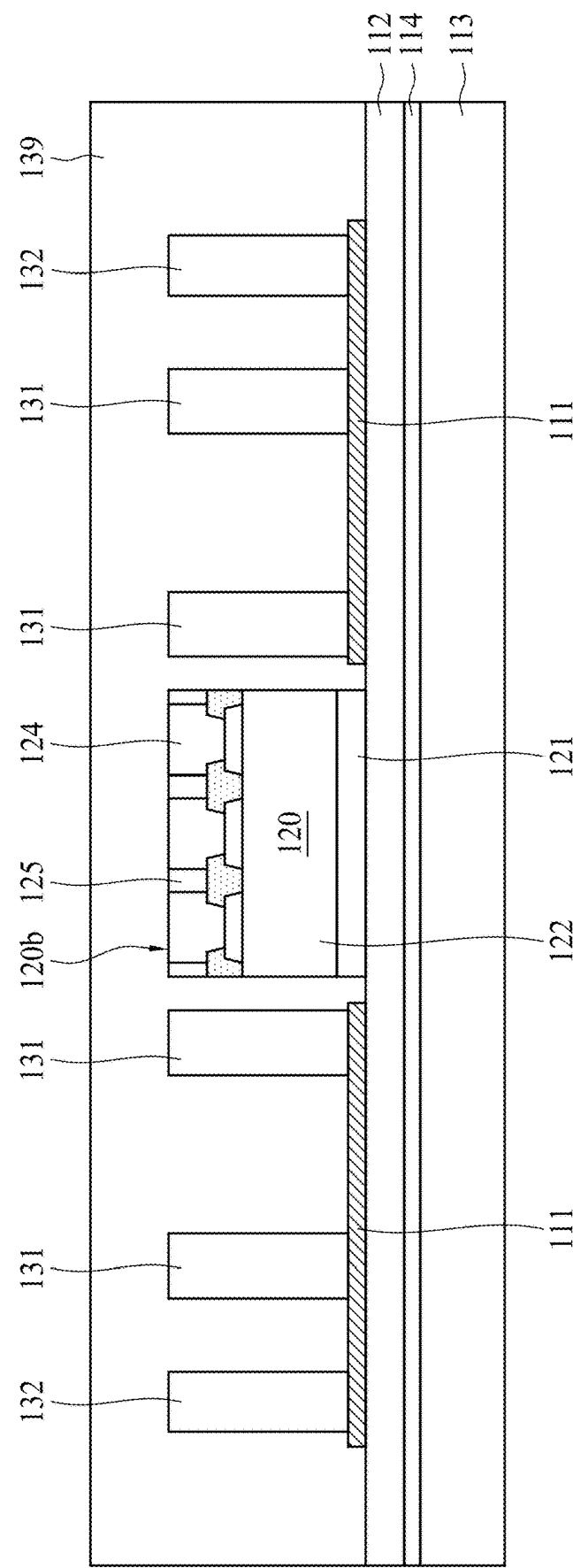

In some embodiments, referring to FIG. 17, a molding material 139 is applied over the die 120 and the first and second conductive vias 131, 132, and is then cured. The molding material 139 surrounds or encapsulates the die 120 and the first and second conductive vias 131, 132, and the molding material 139 is in contact with any exposed portions of the first dielectric layer 112 and the first conductive pattern 111, in some embodiments. In some embodiments, the molding material 139 includes a molding compound, which is liquid epoxy, such as liquid epoxy containing fine granular silica, liquid glass ($SiO_2$) (spin-on glass) or ceramics. Molding compounds such as the liquid epoxy are applicable as a coating, and then cured and hardened at low temperature (about 180° C.). In some embodiments, the top surface of the molding material 139 is higher than the top surface 120b of the die 120 and the top ends of the first and second conductive vias 131, 132.

Figure 18:
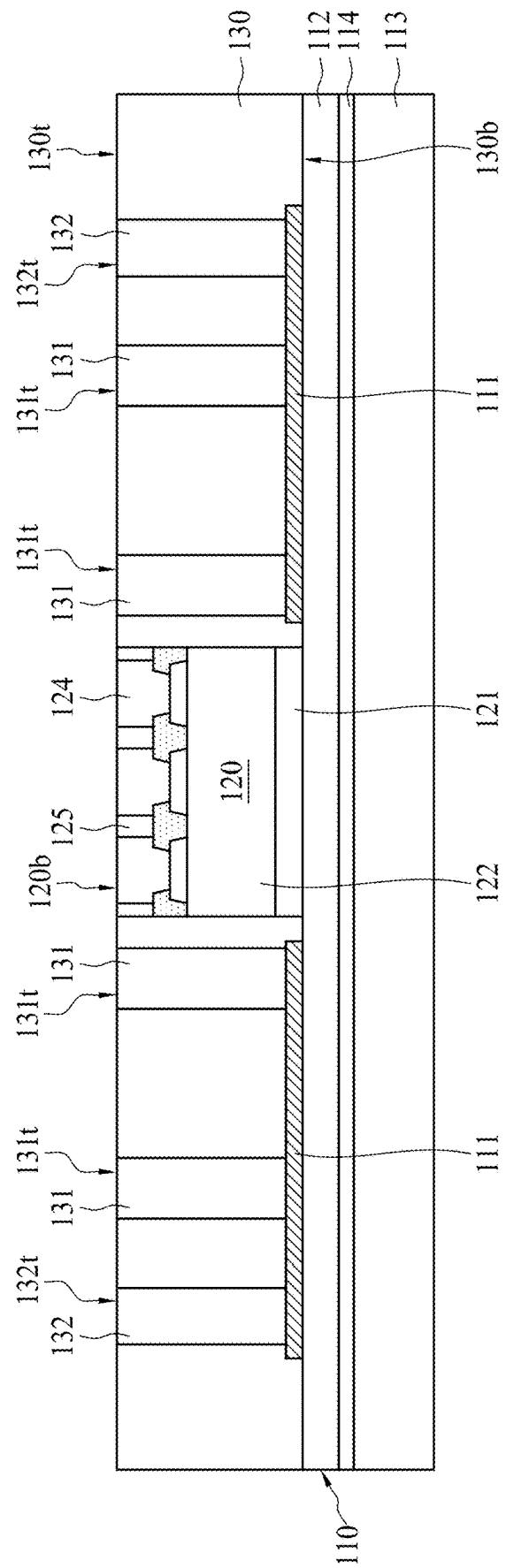

In some embodiments, referring to FIG. 18, the molding material 139 is ground until the top surface 120b of the die 120 and top surfaces 131t, 132t of the first and second conductive vias 131, 132 are exposed. In some embodiments, the molding material 139 is ground by a mechanical grinding process and/or a CMP process. In some embodiments, the grinding causes the top ends of the conductive pillars 124 and the first and second conductive vias 131, 132 to be substantially level (coplanar). In some embodiments, the grinding step leaves behind some metal residue, such as metal particles, on the top surface of the molding material 139. Accordingly, in some embodiments, after the grinding step, a cleaning is performed, for example, through a wet etching, to remove the metal residue.

After the molding material 139 is ground, a molding 130 having a bottom surface 130b and a top surface 130t opposite to the bottom surface 130b is formed. In some embodiments, the molding 130 is disposed over the first redistribution structure 110 to at least laterally encapsulate the die 120. The one or more first and second conductive vias 131, 132 are disposed within the molding 130 and extend from the first conductive patterns 111 toward the top surface 130t of the molding 130.

Figure 19:
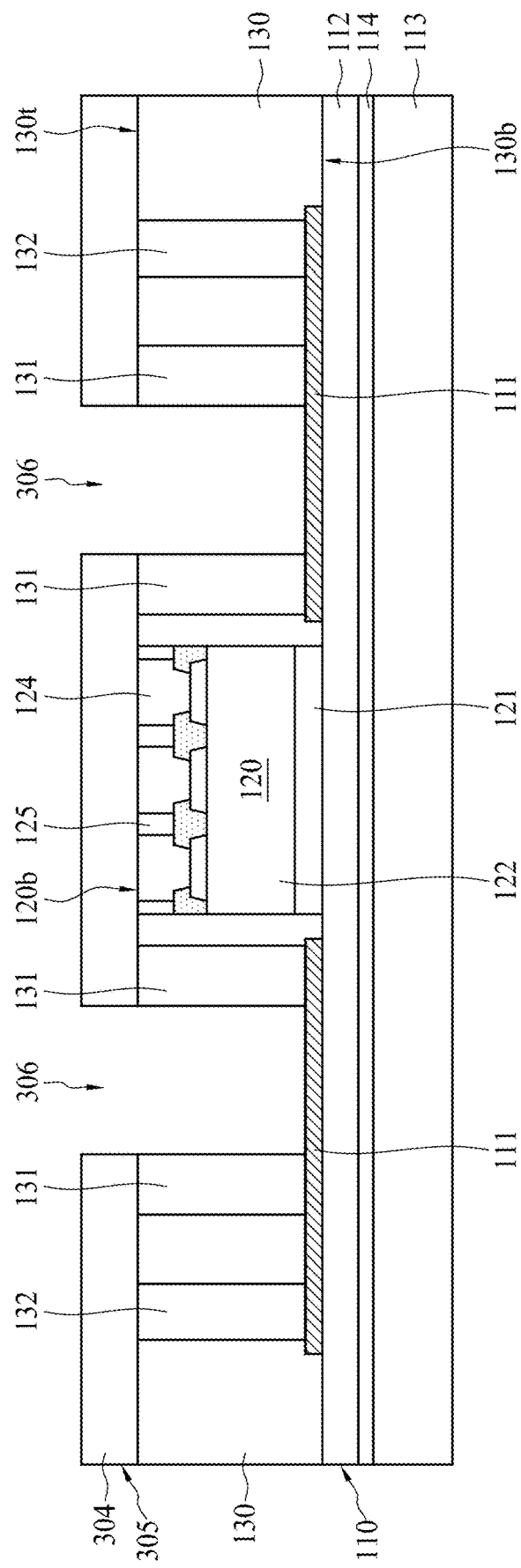

In some embodiments, referring to FIG. 19, a second patterned photoresist 304 is applied over the molding 130 and the first and second conductive vias 131, 132. A portion of the molding 130 disposed in the opening is removed to form a second recess 306. In some embodiments, the molding 130 may be removed through a wet etching process. In some embodiments, the second recess 306 is formed between first conductive vias 131 and exposes some portions of the first conductive patterns 111. The first conductive vias 131 and their associated first conductive patterns 111 define the periphery of the second recess 306.

Figure 20:
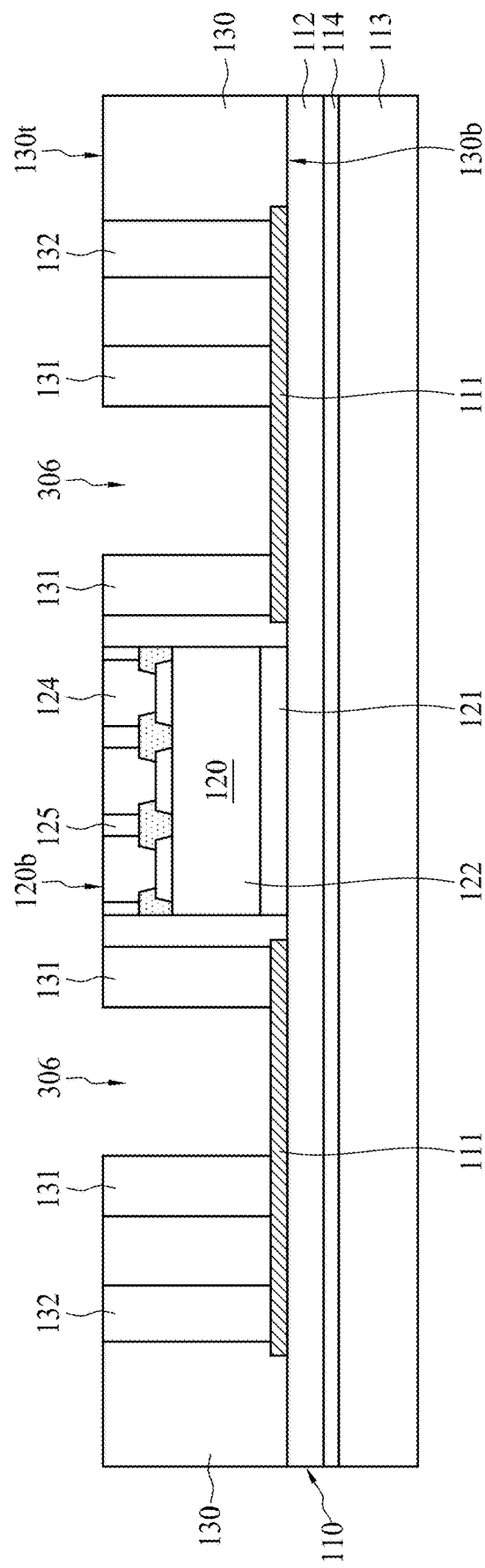

In some embodiments, referring to FIG. 20, the second patterned photoresist 304 is removed through a stripping process, an etching process, and/or a cleaning process. In some embodiments, the removal of the second patterned photoresist 304 is similar to the removal of the first patterned photoresist 302, so repeated descriptions thereof are omitted herein.

Figure 21:
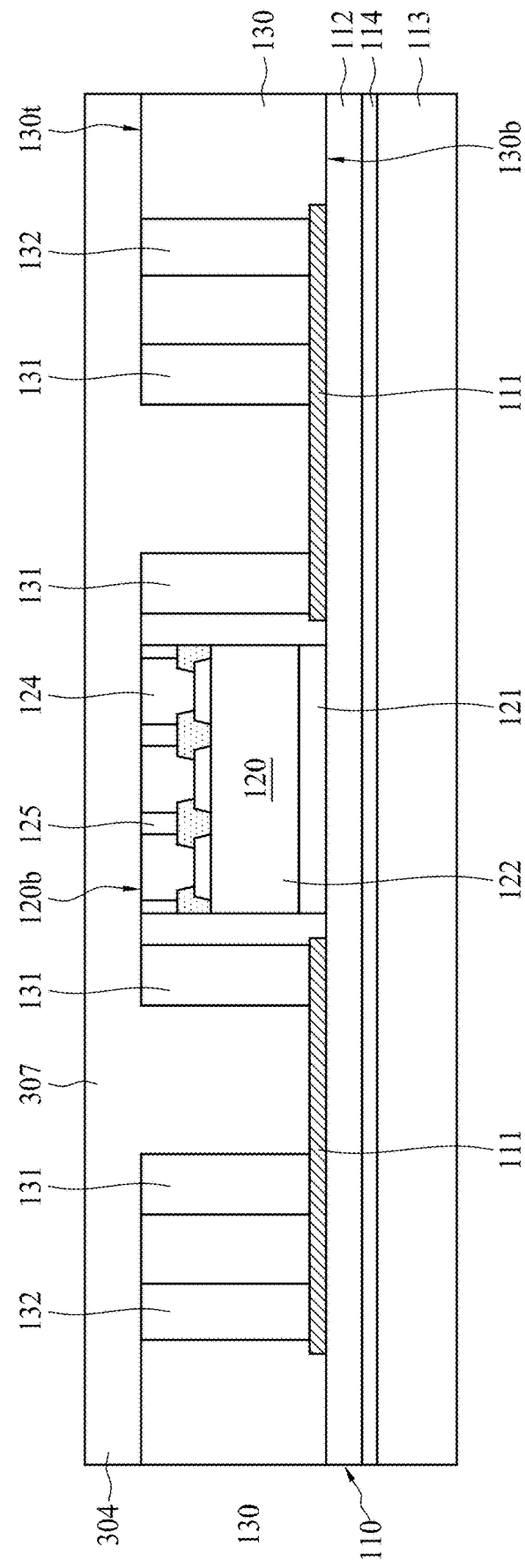

In some embodiments, referring to FIG. 21, a dielectric paste 307 is deposited into the second recess 306 and applied over the die 120, the molding 130, and the first and second conductive vias 131, 132. In some embodiments, the dielectric paste 307 has a dielectric constant k substantially greater than the dielectric constant k of the molding 130. In some embodiments, the dielectric paste 307 may be in contact with the first conductive pattern 111. In some embodiments, the dielectric paste 307 includes $SiO_2$, $SiN_x$, $SiO_xN_y$, $ZrO_2$, $Al_2O_3$, $HfO_x$, $HfSiO_x$, $ZrTiO_x$, $TiO_2$, $TaO_x$, $SrTiO_3$, $BaTiO_3$, $BaSrTiO_3$, $PbZrTiO_3$, a high-k polymer, or a combination thereof. In some embodiments, the high-k polymer is PBO, PI, or the combination thereof. In some embodiments, the dielectric paste 307 is in liquid phase at room temperature. In some embodiments, the dielectric paste 307 is a slurry paste. In some embodiments, the dielectric paste 307 includes a solvent to enhance the coating fluidity. In some embodiments, a dielectric material having a dielectric constant k substantially greater than the dielectric constant k of the molding 130 is deposited to fill the second recess 306 and dispose over the molding 130 and the first and second conductive vias 131, 132.

Figure 22:
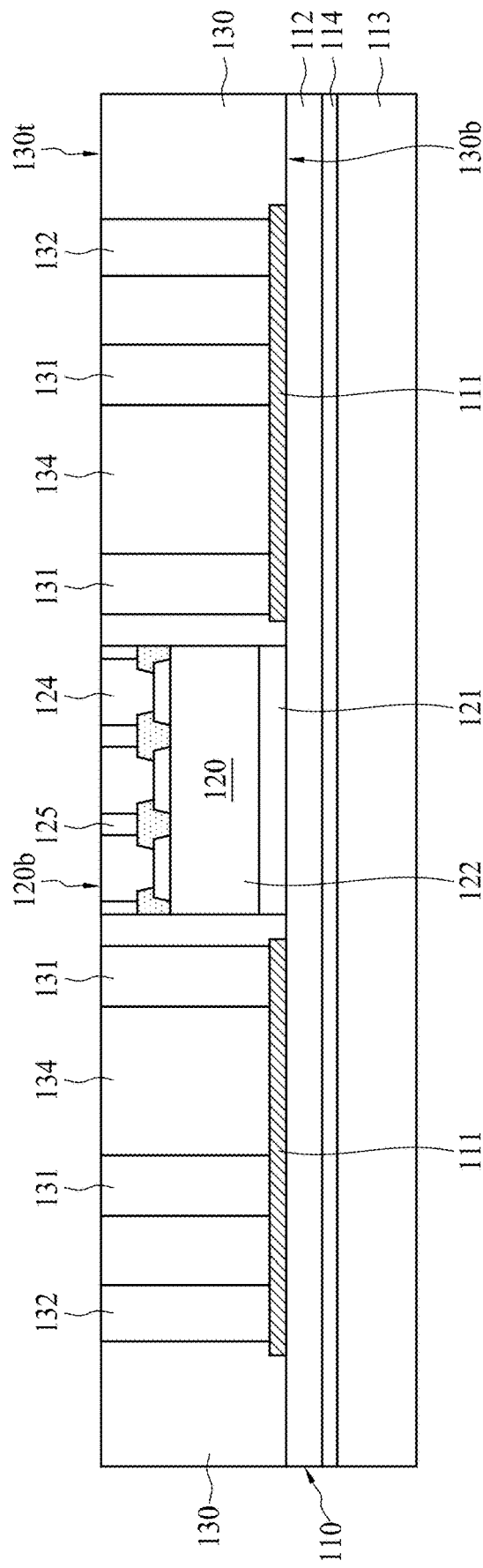

In some embodiments, referring to FIG. 22, a portion of the dielectric paste 307 is removed until a front surface 120b of the die 120 and top surfaces 131t, 132t of the first and second conductive vias 131, 132 are exposed. In some embodiments, the portion of the dielectric paste 307 is removed by a scraper. In some embodiments, the removal causes the top surface of the dielectric paste 307, the die 120, and the first and second conductive vias 131, 132 to be substantially level (coplanar) along the top surface 130t. In some embodiments, after the portion of the dielectric paste 307 is removed, a curing process or hardening process is performed to evaporate the solvent. For example, in some embodiments, the dielectric paste 307 is cured by a soft-baking process, and the temperature of curing the dielectric paste 307 is less than 250° C. In some embodiments, the temperature of the curing is less than 210° C. and more preferably less than 180° C.

After the dielectric paste 307 disposed in the second recess 306 is cured, a dielectric member 134 is formed and disposed on the first redistribution structure 110 and disposed between the first conductive vias 131 and the molding 130. In some embodiments, the dielectric member 134 extends from the first conductive patterns 111 to the top surface 130t of the molding 130.

Figure 23:
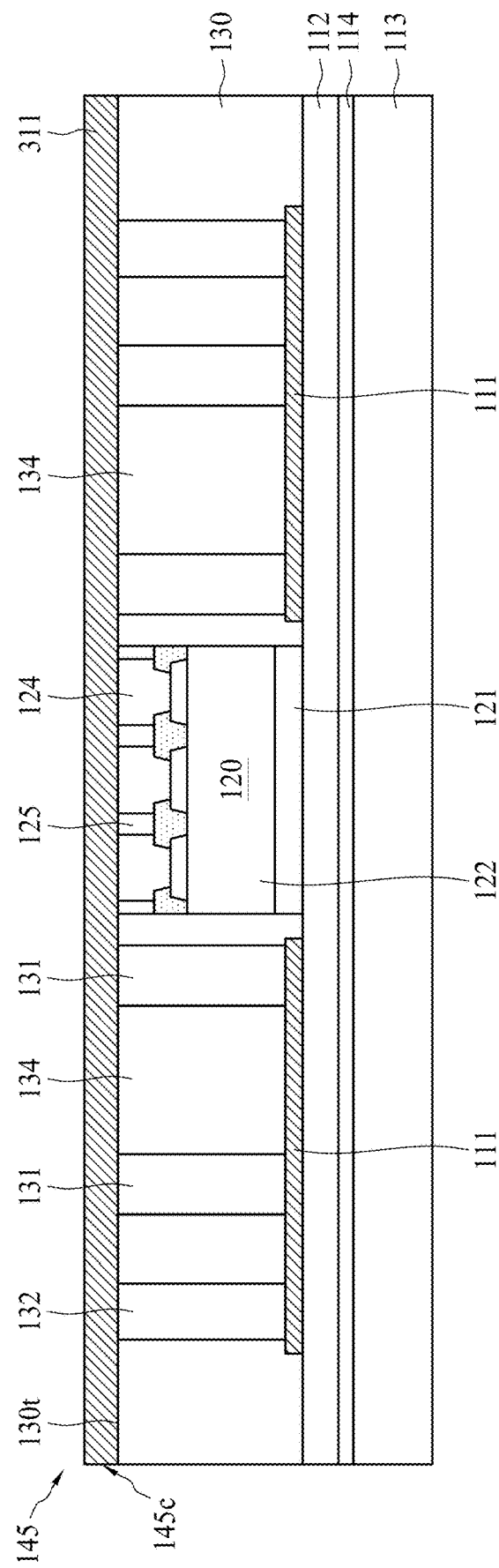

In some embodiments, as in FIG. 23, in order to form the first-level conductor 145c of the first redistribution layer 145, a layer of conductive material (e.g., copper) 311 is deposited over the top surface 130t of the molding 130 by plating, such as electroplating or electro-less plating. In order to enable the electroplating, in some embodiments, a seed layer (not shown) of Ti/Cu having thickness of 1000 to 5000 Å is deposited on the top surface 130t, and a layer of conductive material 311 is applied on the seed layer. Next, the layer of conductive material 311 is patterned and etched, leaving behind the first-level conductor 145c over the first and second conductive vias 131, 132 and the conductive pillars 124 of the die 120.

Figure 24:
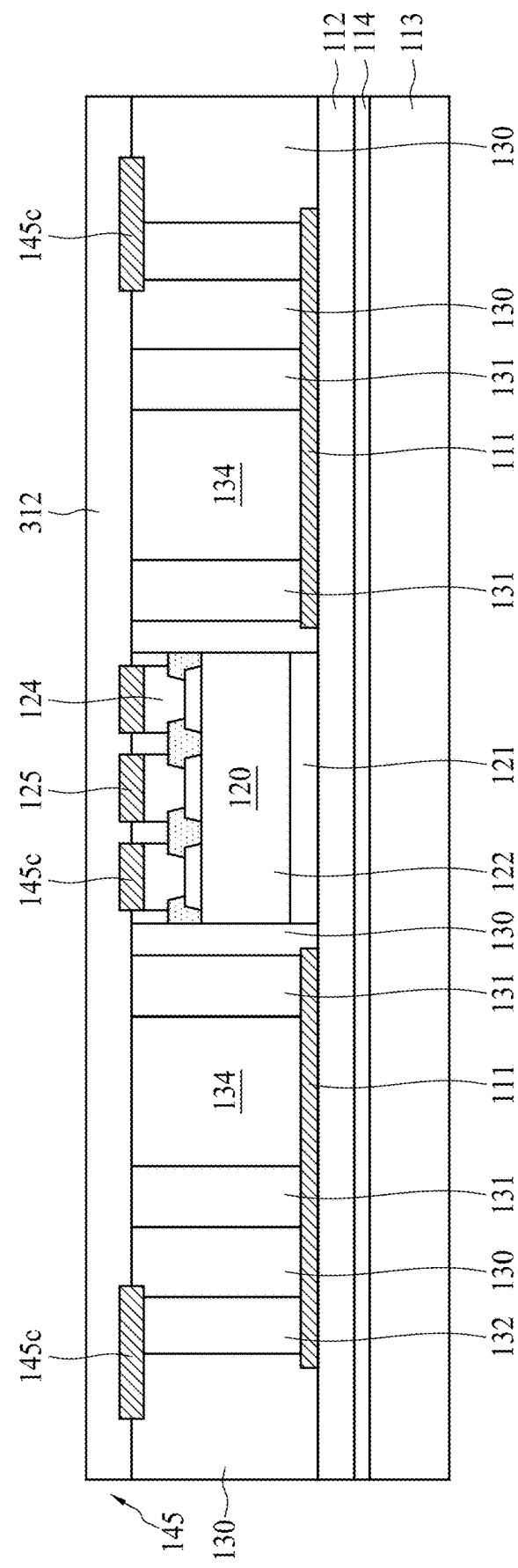

Then, referring to FIG. 24, in some embodiments, a first insulating layer 312 (e.g., PBO) is applied over the resulting structure. The first insulating layer 312 has a thickness between about 3 µm and about 20 µm. As a thickness of the first insulating layer 312 increases, the cost of the first insulating layer 312 is too high in some embodiments. As a thickness of the first insulating layer 312 decreases, the process parameters of the current manufacturing process are not applicable in some embodiments. In some embodiments, the first insulating layer 312 has a thickness between about 3 µm and about 7 µm. In some embodiments, the first insulating layer 312 has a thickness about 6 µm.

In some embodiments, formation of the second redistribution structure 140 is followed by patterning the first insulating layer 312 and forming openings for vias, which are then filled with conductive material (e.g., copper) to form the first-level vias 145v, the first insulating layer 145i, and completing the first redistribution layer 145. The top surface of the first redistribution layer 145 is ground and polished. In some embodiments, the second redistribution layer 146 is then formed on the first redistribution layer 145. In order to form the second redistribution layer 146, a layer of conductive metal (e.g., copper) is deposited over the first redistribution layer 145 and then patterned and etched, leaving behind the second-level conductor 146c over the first redistribution layer 145.

Figure 25:
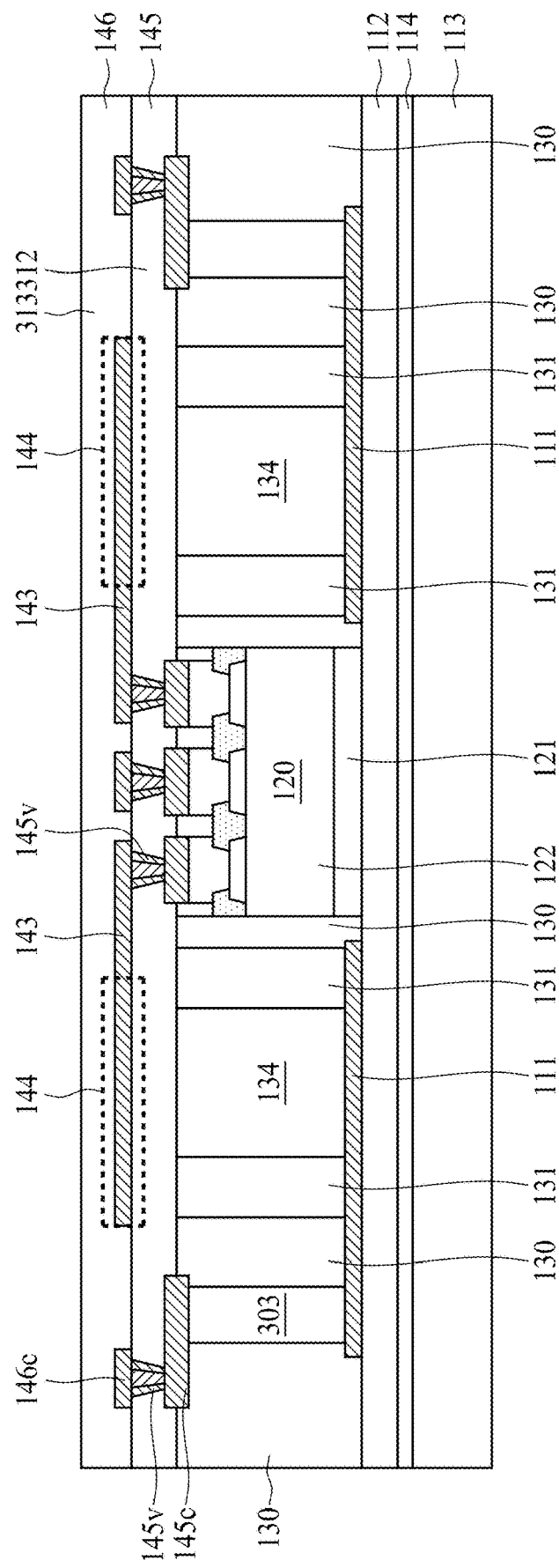

In some embodiments, referring to FIG. 25, a second insulating layer (e.g., PBO) 313 is then applied over the resulting structure. In some embodiments, some of the second-level conductors 146c include the antenna structures 144. The antenna structures 144 are formed over the dielectric member 134 surrounded by the first conductive vias 131 and the first conductive pattern 111.

Formation of the second redistribution structure 140 is followed by patterning the second insulating layer 313 and forming openings, which are then filled with conductive metal (e.g., copper) to form the second-level vias 146v, and completing the second redistribution layer 146. The top surface of the second redistribution layer 146 is ground and polished. Next, the third redistribution layer 147 is formed on the second redistribution layer 146. In order to form the third redistribution layer 147, a layer of conductive material (e.g., copper) is deposited over the second redistribution layer 146, and then patterned and etched, leaving behind the third-level conductor 147c structures over the second redistribution layer 146.

Figure 26:
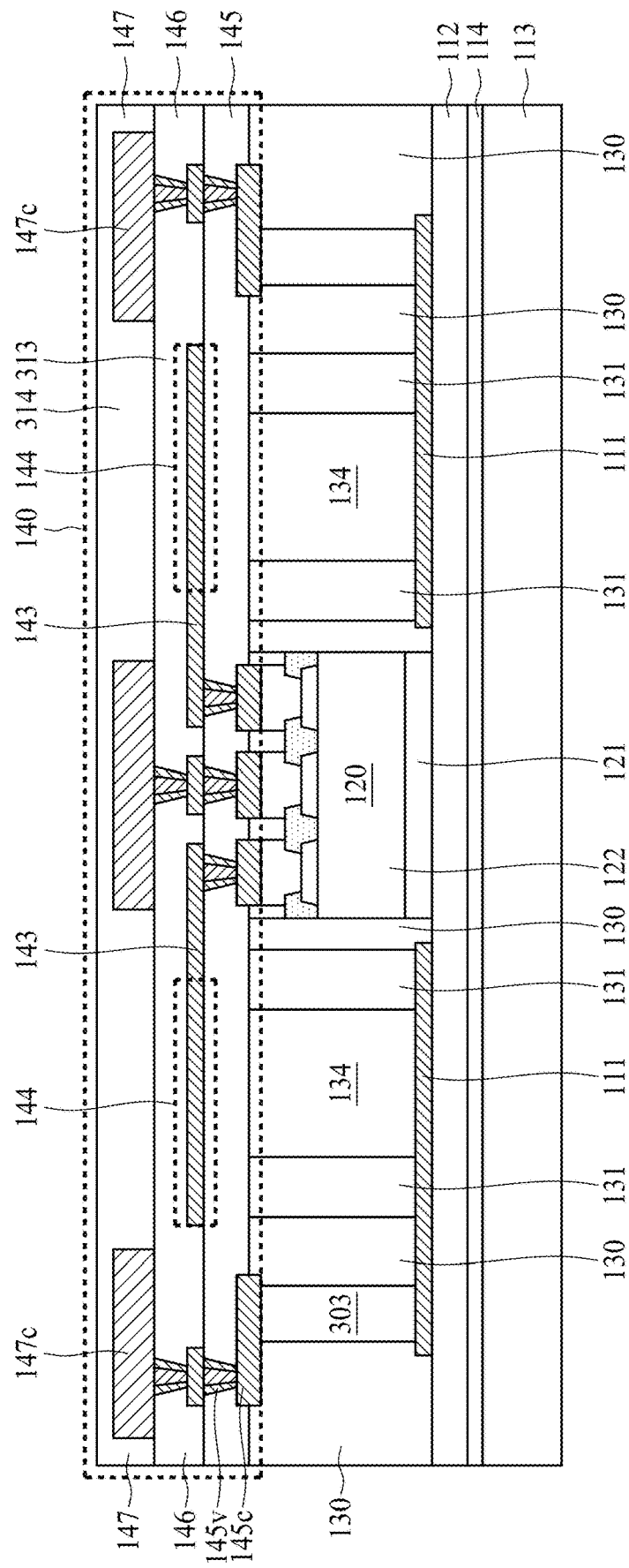

In some embodiments, referring to FIG. 26, a third insulating layer (e.g., PBO) 314 is next applied over the resulting structure. In some embodiments, a material and a formation method of the third insulating layer 314 are similar to those of the first insulating layer 312 and the second insulating layer 313, so repeated descriptions thereof are omitted herein for the sake of brevity.

Figure 27:
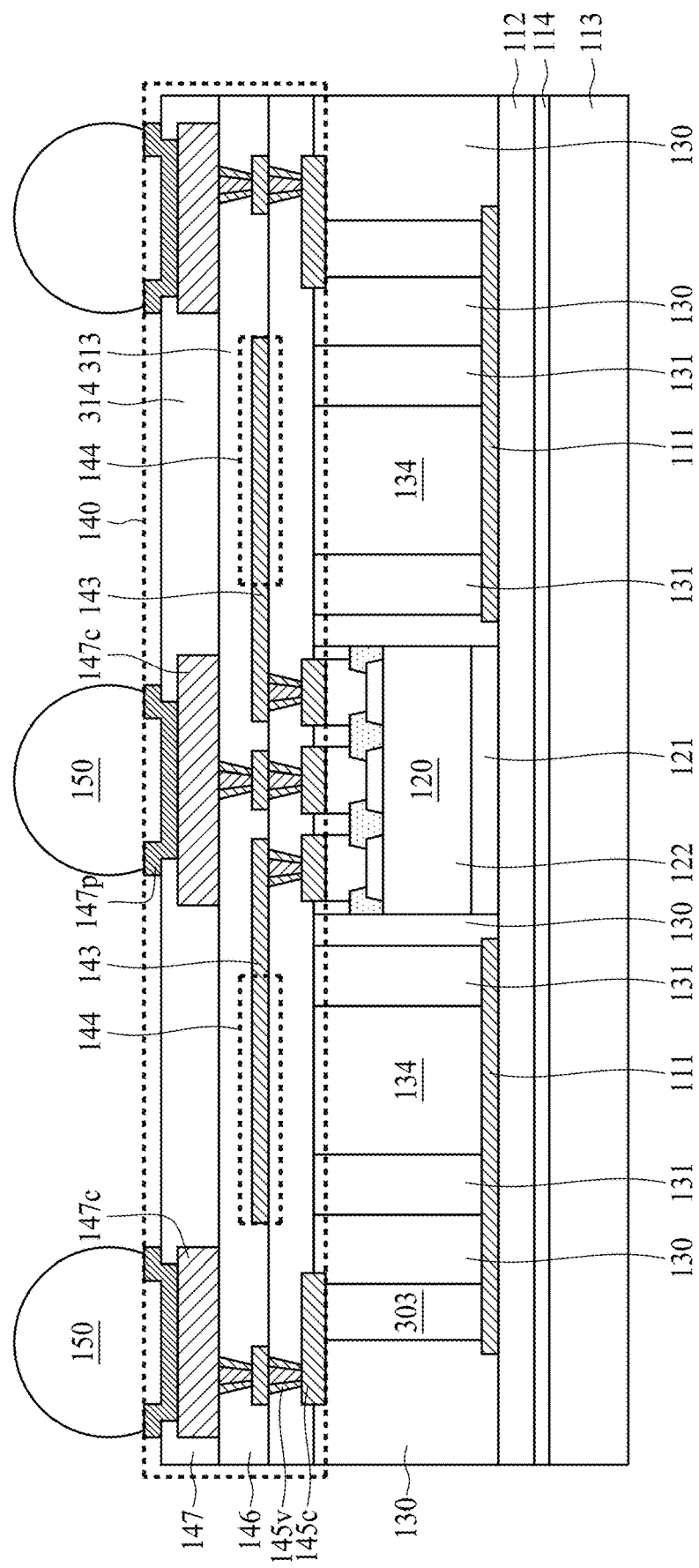

In some embodiments, referring to FIG. 27, forming the second redistribution structure 140 is followed by patterning the third insulating layer 314 and forming openings for under ball metal (UBM) pads 147p, which are then filled with conductive metal to form the UBM pads 147p and completing the third redistribution layer 147.

In some embodiments, the conductive bumps 150 are disposed on the UBM pads 147p. In some embodiments, the conductive bump 150 is attached to the UBM pad 147p through a solder flux. In some embodiments, the conductive bump 150 is disposed on the second redistribution structure 140 by a ball placement process and/or a reflowing process. In some embodiments, the formation of the conductive bump 150 includes performing a plating step to form solder regions over the UBM pads 147p, and then reflowing the solder regions.

Figure 28:
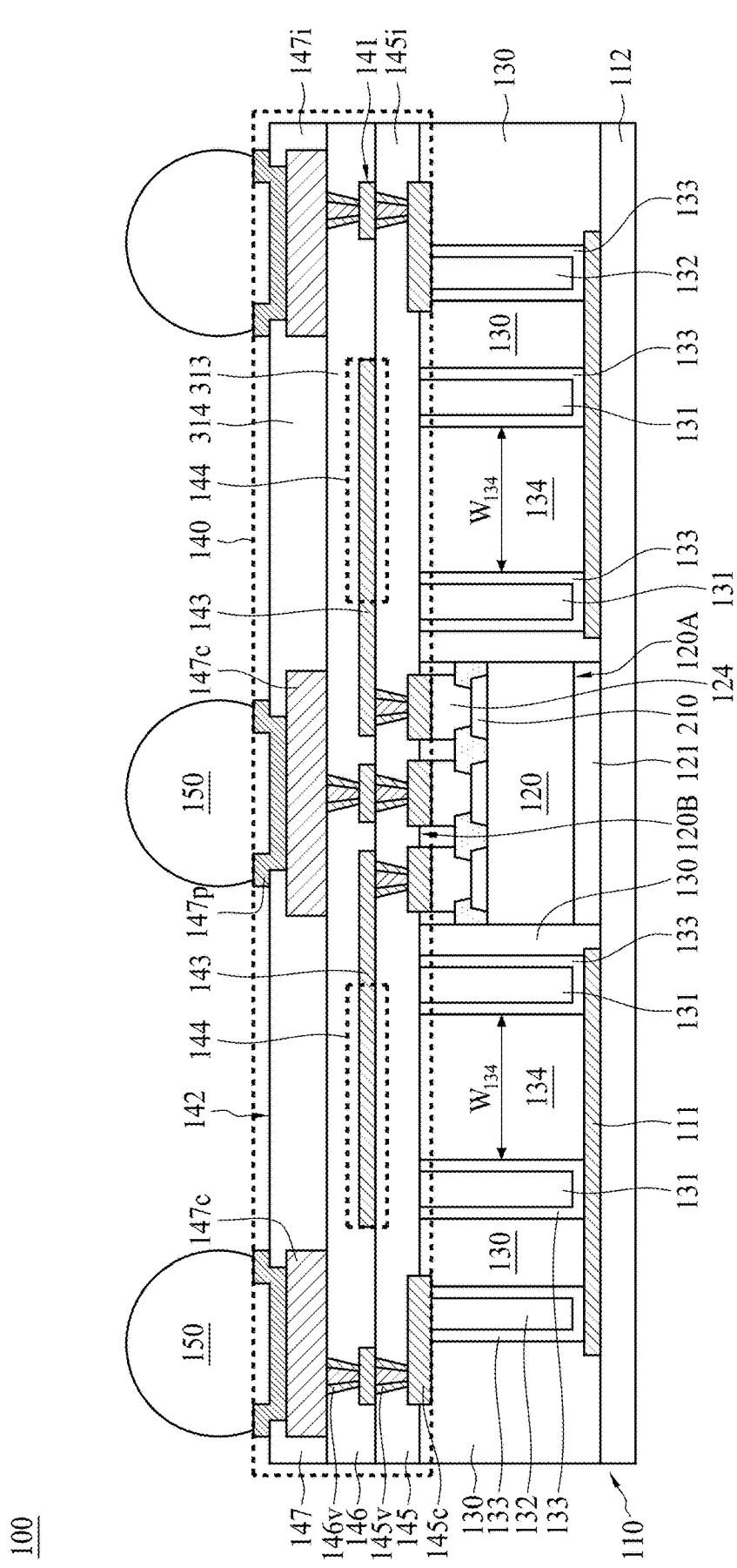

After the conductive bump 150 is mounted on the second redistribution structure 140, the adhesive layer 114 and the supporting substrate 113 are removed or detached from the first redistribution structure 110, as in FIG. 28. In some embodiments, the adhesive layer 114 (e.g., the LTHC release layer) is irradiated by a UV laser such that the supporting substrate 113 and the adhesive layer 114 are able to be peeled off from the first dielectric layer 112. However, the detachment process is not limited thereto. Other suitable methods are usable in some embodiments. Thereafter, a singulation process is performed to form a plurality of semiconductor structures 100. In some embodiments, the dicing process or the singulation process typically involves dicing with a rotating blade or a laser beam. In other words, the dicing or singulation process is, for example, a laser cutting process, a mechanical cutting process, or another suitable process. In some embodiments, the semiconductor structure 100 is referred to as an integrated fan-out (InFO) package. However, the disclosure is not limited thereto. In some embodiments, the semiconductor structure 100 is another type of package.

An aspect of this disclosure relates to a semiconductor structure. The semiconductor structure includes a first redistribution structure, wherein the first redistribution structure includes first conductive pattern. The semiconductor structure further includes a die over the first redistribution structure. The semiconductor structure further includes a molding over the first redistribution structure, wherein the molding surrounds the die, and the molding has a first dielectric constant. The semiconductor structure further includes a dielectric member extending through the molding, wherein the dielectric member has a second dielectric constant different from the first dielectric constant. The semiconductor structure further includes a second redistribution structure over the die, the dielectric member and the molding, wherein the second redistribution layer includes an antenna over the dielectric member, and the antenna is electrically connected to the die. In some embodiments, the second dielectric constant is greater than the first dielectric constant. In some embodiments, the semiconductor structure further includes a conductive via extending through the molding, wherein the conductive via is electrically connected to the first conductive pattern. In some embodiments, the conductive via is in contact with the dielectric member. In some embodiments, the dielectric member is isolated from the antenna. In some embodiments, the dielectric member is between the antenna and the first conductive pattern. In some embodiments, the dielectric member is in contact with the first conductive pattern. In some embodiments, the dielectric member and the antenna overlap in a plan view. In some embodiments, the second dielectric constant is equal to or greater than 3. In some embodiments, the dielectric member includes $SiO_2$, $SiN_x$, $SiO_xN_y$, $ZrO_2$, $Al_2O_3$, HfOx, $HfSiO_x$, $ZrTiO_x$, $TiO_2$, $TaO_x$, $SrTiO_3$, $BaTiO_3$, $BaSrTiO_3$, $PbZrTiO_3$, high-k polymer, or a combination thereof. In some embodiments, a width of the dielectric member is greater than or equal to a width of the antenna.

An aspect of this disclosure relates to a semiconductor structure. The semiconductor structure includes a first redistribution structure. The semiconductor structure further includes a molding over the first redistribution structure, wherein the molding has a first dielectric constant. The semiconductor structure further includes a die surrounded by the molding. The semiconductor structure further includes a plurality of dielectric members surrounded by the molding, wherein a dielectric constant of each of the plurality of dielectric members is different from the first dielectric constant. The semiconductor structure further includes a second redistribution structure over the die, wherein the second redistribution structure includes a plurality of antenna structures, each of the plurality of antenna structures is electrically connected to the die, and each of the plurality of antenna structure is over a corresponding dielectric member of the plurality of dielectric members. In some embodiments, the semiconductor structure further includes a plurality of conductive vias extending through the molding, wherein each of the plurality of conductive vias is along a periphery of a corresponding dielectric member of the plurality of dielectric members. In some embodiments, the second redistribution structure further includes a plurality of conductive lines, and each of the plurality of conductive lines extends from a corresponding antenna structure of the plurality of antenna structures. In some embodiments, the first redistribution structure includes a grounded conductive pattern. In some embodiments, the dielectric constant of each of the plurality of dielectric members is greater than the first dielectric constant.

An aspect of this disclosure relates to a method of forming a semiconductor structure. The method includes forming a first redistribution structure including a first conductive pattern. The method further includes placing a die over the first redistribution structure. The method further includes disposing a molding material over the first redistribution structure to surround the die. The method further includes removing a portion of the molding material to form an opening. The method further includes disposing a dielectric material into the opening to form a dielectric member. The method further includes forming a second redistribution structure over the molding material and the dielectric member, wherein the second redistribution structure includes an antenna structure over the dielectric member and electrically connected to the die. In some embodiments, a dielectric constant of the dielectric material is different from a dielectric constant of the molding material. In some embodiments, the method further includes forming a plurality of conductive vias extending through the molding, wherein forming the opening includes forming the opening surrounded by the plurality of conductive vias. In some embodiments, the method further includes forming a conductive bump over the second redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a first redistribution structure, wherein the first redistribution structure comprises a first conductive pattern;
 a die over the first redistribution structure;
 a molding over the first redistribution structure, wherein the molding surrounds the die, a first portion of the molding contacts the die, and the molding has a first dielectric constant;
 a dielectric member extending through the molding, wherein the dielectric member has a second dielectric constant different from the first dielectric constant, the dielectric member is between the first portion of the molding and a second portion of the molding separated from the die, and the dielectric member and an antenna overlap in a plan view; and
 a second redistribution structure over the die, the dielectric member and the molding, wherein the second redistribution layer comprises the antenna over the dielectric member, and the antenna is electrically connected to the die.

2. The semiconductor structure of claim 1, wherein the second dielectric constant is greater than the first dielectric constant.

3. The semiconductor structure of claim 1, further comprising a conductive via extending through the molding, wherein the conductive via is electrically connected to the first conductive pattern.

4. The semiconductor structure of claim 3, wherein the conductive via is in contact with the dielectric member.

5. The semiconductor structure of claim 1, wherein the dielectric member is isolated from the antenna.

6. The semiconductor structure of claim 1, wherein the dielectric member is between the antenna and the first conductive pattern.

7. The semiconductor structure of claim 1, wherein the dielectric member is in contact with the first conductive pattern.

8. The semiconductor structure of claim 1, wherein the dielectric member comprises a high-k material.

9. The semiconductor structure of claim 1, wherein the second dielectric constant is equal to or greater than 3.

10. The semiconductor structure of claim 1, wherein the dielectric member includes $SiO_2$, $SiN_x$, $SiO_xN_y$, $ZrO_2$, $Al_2O_3$, $HfO_x$, $HfSiO_x$, $ZrTiO_x$, $TiO_2$, $TaO_x$, $SrTiO_3$, $BaTiO_3$, $BaSrTiO_3$, $PbZrTiO_3$, high-k polymer, or a combination thereof.

11. The semiconductor structure of claim 1, wherein a width of the dielectric member is greater than or equal to a width of the antenna.

12. A semiconductor structure, comprising:
 a first redistribution structure;
 a molding over the first redistribution structure, wherein the molding has a first dielectric constant;
 a die surrounded by the molding;
 a plurality of dielectric members surrounded by the molding, wherein a dielectric constant of each of the plurality of dielectric members is different from the first dielectric constant;
 a second redistribution structure over the die, wherein the second redistribution structure comprises a plurality of antenna structures, each of the plurality of antenna structures is electrically connected to the die, and each of the plurality of antenna structures is over a corresponding dielectric member of the plurality of dielectric members; and
 a plurality of conductive vias extending through the molding, wherein each of the plurality of conductive vias is along a periphery of a corresponding dielectric member of the plurality of dielectric members.

13. The semiconductor structure of claim 12, wherein a first dielectric member of the plurality of dielectric members is between the molding and the die.

14. The semiconductor structure of claim 12, wherein the second redistribution structure further comprises a plurality of conductive lines, and each of the plurality of conductive lines extends from a corresponding antenna structure of the plurality of antenna structures.

15. The semiconductor structure of claim 12, wherein the first redistribution structure includes a grounded conductive pattern.

16. The semiconductor structure of claim 12, wherein the dielectric constant of each of the plurality of dielectric members is greater than the first dielectric constant.

17. A semiconductor structure, comprising:
- a first redistribution structure, wherein the first redistribution structure comprises a first conductive pattern;
- a die over the first redistribution structure;
- a molding surrounding the die, wherein the molding has a first dielectric constant;
- a plurality of conductive vias extending through the molding;
- a dielectric member between adjacent conductive vias of the plurality of conductive vias, wherein the dielectric member has a second dielectric constant greater than the first dielectric constant; and
- a second redistribution structure over the die, the plurality of conductive vias, the dielectric member and the molding.

18. The semiconductor structure of claim 17, further comprising an antenna in the second redistribution structure, wherein the antenna is electrically connected to the die.

19. The semiconductor structure of claim 17, wherein a first conductive via of the plurality of conductive vias is between the dielectric member and the die.

20. The semiconductor structure of claim 19, wherein the dielectric member is between the die and a second conductive via of the plurality of conductive vias.

* * * * *